(12) United States Patent
Zhovnirnovsky et al.

(10) Patent No.: US 9,258,084 B2
(45) Date of Patent: Feb. 9, 2016

(54) METHOD AND IMPLEMENTATION FOR NETWORK COEFFICENTS SELECTION

(71) Applicants: Igor Zhovnirnovsky, Newton, MA (US); Roy Subhash, Lexington, MA (US)

(72) Inventors: Igor Zhovnirnovsky, Newton, MA (US); Roy Subhash, Lexington, MA (US)

(73) Assignee: Q FACTOR COMMUNICATIONS CORP., Burlington, MA (US)

( * ) Notice: Subject to any disclaimer, the term of this patent is extended or adjusted under 35 U.S.C. 154(b) by 0 days.

(21) Appl. No.: 14/538,793

(22) Filed: Nov. 11, 2014

(65) Prior Publication Data

US 2015/0095739 A1 Apr. 2, 2015

Related U.S. Application Data

(63) Continuation of application No. PCT/US2013/069018, filed on Nov. 7, 2013, and a continuation of application No. PCT/US2013/068820, filed on Nov. 6, 2013.

(60) Provisional application No. 61/724,275, filed on Nov. 8, 2012, provisional application No. 61/820,682, filed on May 7, 2013, provisional application No. 61/867,583, filed on Aug. 19, 2013.

(51) Int. Cl.
*H03M 13/00* (2006.01)
*H04L 1/00* (2006.01)
*H04L 29/06* (2006.01)
*H04W 80/06* (2009.01)

(52) U.S. Cl.
CPC ........... *H04L 1/0042* (2013.01); *H03M 13/616* (2013.01); *H03M 13/6502* (2013.01); *H04L 69/16* (2013.01); *H04W 80/06* (2013.01)

(58) Field of Classification Search
CPC ..... H04L 1/0042; H04L 69/16; H04W 80/06; H03M 13/616; H03M 13/6502
See application file for complete search history.

(56) References Cited

U.S. PATENT DOCUMENTS

2014/0016469 A1* 1/2014 Ho et al. ................ 370/235
2014/0064296 A1* 3/2014 Haeupler ............ H04L 49/90
370/412

OTHER PUBLICATIONS

Koetter et. al An Algebraic Approach to Network Coding, Oct. 2003, IEEE/ACM transaction vol. 11, No. 5, pp. 782-795.*

* cited by examiner

*Primary Examiner* — Sam Rizk
(74) *Attorney, Agent, or Firm* — Handal & Morofsky LLC

(57) ABSTRACT

A method and apparatus that improves the performance of TCP (and other protocols) in a data network by implementing segmenting the TCP path and implementing a proprietary protocol (DPR™) over the network. The DPR™ protocol provides a multiplexed tunnel for a multiplicity of TCP sessions from a client to a cloud proxy. DPR™ implements congestion management, flow control, reliability, and link monitoring. Other network protocols (such as UDP) are supported with a reliability protocol based upon network coding that improves the transmission reliability. A network and a method for transmitting processes in a network are disclosed, using deterministic coefficients for encoding packets based on network coding principles. Disclosed is a method and implementation for using deterministic coefficients for encoding packets based on network coding principles. The use of deterministic coefficients reduces the need for extra information to be transmitted to recover the lost packets and results in significantly reduced overhead and increased performance, security and reliability.

7 Claims, 18 Drawing Sheets

Network Coding Decoding Operation

DLNC Format

| 31 | 24 23 | 16 15 | 8 7 | 0 |
|---|---|---|---|---|
| Frame Type | | Frame Length | | Payload Type |
| Try ## | | Generation ID | | |
| N of Packets | | Payload Packet Length | | Payload |
| Payload | Payload | Payload | | Payload |
| Payload | Payload | Payload | | Payload |
| Payload | Payload | Payload | | Payload |
| Payload | Payload | Payload | | Payload |

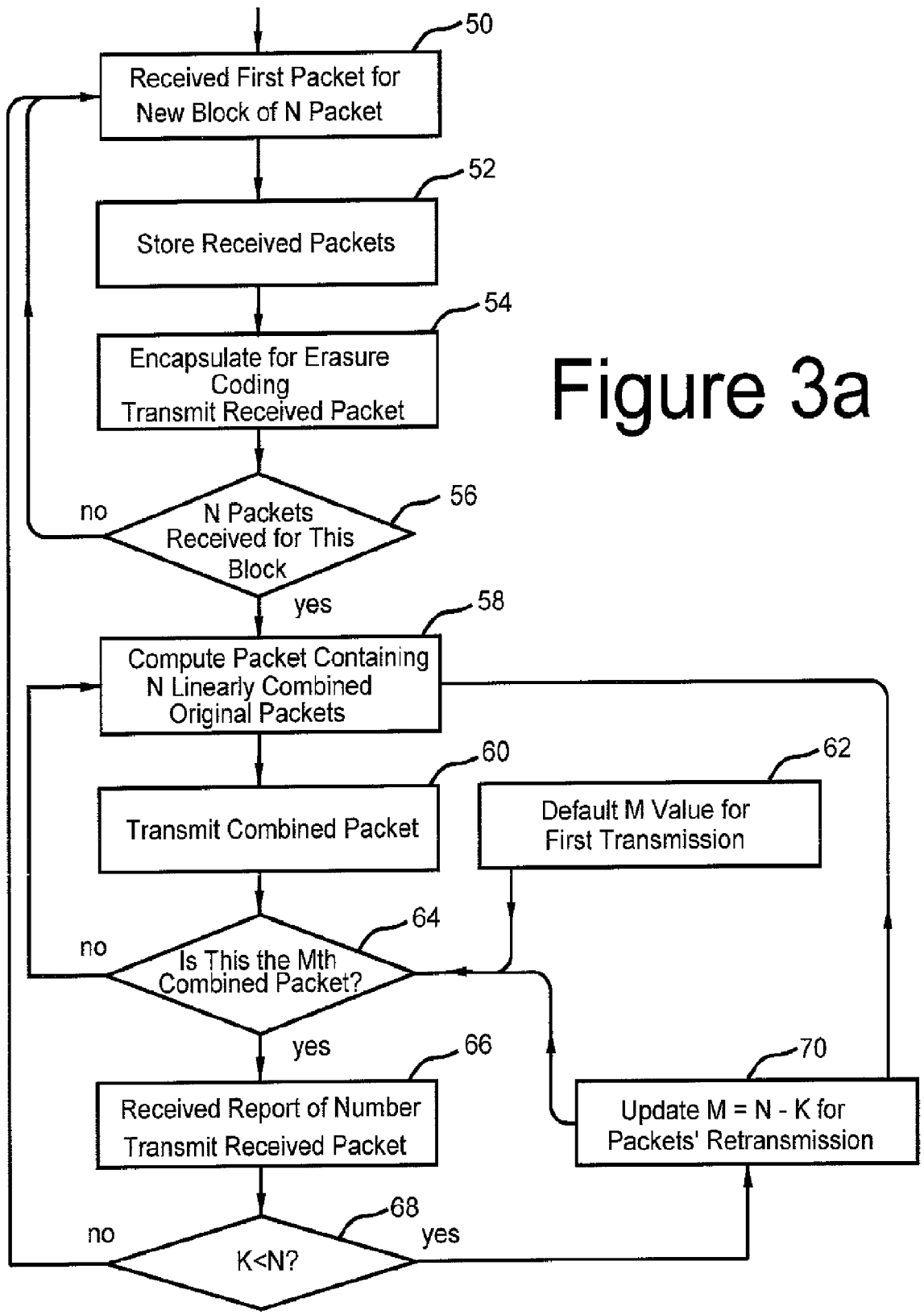

$NC = a_1 \times packet1 + a_2 \times packet2 + a_3 \times packet3 + \ldots + a_n \times packetn$ Network Coding Encoding Operation $$\begin{bmatrix} a_{11} & a_{12} & a_{13} \cdots a_{1n} \\ a_{21} & a_{22} & a_{23} \cdots a_{3n} \\ a_{31} & a_{32} & a_{33} \cdots a_{3n} \\ & & \cdot \\ & & \cdot \\ & & \cdot \\ a_{n1} & a_{n2} & a_{n3} \cdots a_{nn} \end{bmatrix} \times \begin{bmatrix} \text{packet1} \\ \text{packet2} \\ \text{packet3} \\ \cdot \\ \cdot \\ \cdot \\ \text{packet n} \end{bmatrix} = \begin{bmatrix} NC_1 \\ NC_2 \\ NC_3 \\ \cdot \\ \cdot \\ \cdot \\ NC_n \end{bmatrix}$$

Known coefficients             Recieved packets

Decoding operation; solve a set of linear equations

Network Coding Decoding Operation

DLNC Format

| 31 | 24 23 | 16 15 | 8 7 | 0 |
|---|---|---|---|---|
| Frame Type | Frame Length | | | Payload Type |
| Try ## | Generation ID | | | |
| N of Packets | Payload Packet Length | | | |
| Payload | | | Payload | |
| Payload | | | Payload | |
| Payload | | | Payload | |
| Payload | | | Payload | |
| Payload | | | | |

Figure 14

METHOD AND IMPLEMENTATION FOR NETWORK COEFFICENTS SELECTION

CROSS-REFERENCE TO RELATED APPLICATIONS/INCORPORATION BY REFERENCE

This patent application makes reference to, claims priority to and claims benefit from: U.S. Provisional Patent Application Ser. No. 61/724,275 entitled METHOD AND APPARATUS FOR IMPROVING THE PERFORMANCE OF TCP AND OTHER NETWORK PROTOCOLS IN A COMMUNICATIONS NETWORK, filed on Nov. 8, 2012 and U.S. Provisional Patent Application Ser. No. 61/820,682 entitled METHOD AND IMPLEMENTATION FOR NETWORK CODING COEFFICIENTS SELECTION, filed May 7, 2013 and U.S. Provisional Patent Application Ser. No. 61/867,583 entitled METHOD & APPARATUS FOR IMPROVING THE PERFORMANCE OF TCP AND OTHER NETWORK PROTOCOLS IN A COMMUNICATIONS NETWORK USING PROXY SERVERS, filed on Aug. 19, 2013. Each of the applications are hereby incorporated herein by reference in its entirety.

FIELD OF THE INVENTION

The invention relates generally to communication networks. More specifically, the invention provides for improved communication performance over lossy links. A new erasure coding method is also disclosed.

BACKGROUND

The disclosure includes aspects of a packet transmission apparatus, a communication system and a program.

Data communication over wireless channels has become increasingly common. For example, WiFi is used for wireless communication for connections based on the IEEE 802.11 standard. Many other wireless channels may be used such as WiMAX, 3G, mesh networks, or community networks, to name a few. Wireless channels may be lossy such that data may often be lost during transmission due to any one of a variety of conditions. For example, weather conditions may be such that the transmission of communication data may be impaired. Likewise, there may be interference to data transmission from a variety of causes such as interference from other devices transmitting on the same channel. The wired communication channels may be lossy similarly to wireless channel as well. Even though the wired channel's transmission medium is less susceptible to external interference the active devices deployed in wired networks possess finite resources that contribute to transmission losses if overwhelmed by multiple, uncorrelated transmission sources. Any of these factors may contribute to additional loss in data packet transmission or increased data packet erasure rates.

In end-to-end transport protocols, e.g. Transmission Control Protocol (TCP), data communication is provided across interconnected networks or devices. Transmission Control Protocol (TCP) is utilized in communications networks in order to provide a mechanism for reliability, flow control, and congestion control.

In such transport protocols, of which TCP is one example, data to be transmitted is broken into packets of data. The data packets are transmitted to a receiver where the packets are verified and reassembled into the original message. An acknowledgement (ACK) is returned from the receiver to indicate that the data packets were received. If an ACK is not returned, the data packet may have to be re-transmitted. In addition, when the sender does not receive the ACK within a specified period of time, the transport protocol at the sender may timeout. This results in a reduced rate of transmission of packets as the transport protocol interprets the lack of an ACK as congestion in the network. Communications networks are by definition statistical in nature and packets are commonly lost creating "erasure losses" or received in a different transmitted order creating an "out of order delivery." TCP will retransmit lost packets, rearrange received out of order packet sequences, and modulate transmission rates to minimize perceived congestion losses.

TCP is optimized for reliable data delivery rather than minimizing transmission latency or maximizing network good-put. TCP incorporates algorithms for effective congestion management but not to minimize congestive losses (such as TCP Tahoe, Vegas and Reno) and relies upon end-to-end acknowledgements which limits the maximum transmission rates based upon the round trip time of the communications link. Since the round trip time of a communications link has no direct correlation with the available bandwidth, the maximum TCP transmission rate for a session is not tied to the available communications bandwidth.

When data packet loss is not due to congestion (e.g., packet loss is due to packet erasure or loss/corruption of packets in a lossy wireless link), TCP performance may suffer by interpreting such losses as congestion and invoking its congestion avoidance mechanism. Such congestion control may cause TCP to underestimate link capacity that results in a reduction of the congestion window and underutilization of available capacity. TCP suffers substantial performance degradation with long latency channels that even have only a 1% residual error rate. The confusion between congestion and non-congestive loss exists for other transport protocols as well.

Thus for all of its benefits, TCP suffers from a number of issues such as performance degradation, particularly in wireless links due to such problems as high bit error rates, packet erasure, or intermittent connectivity. In addition, data packet erasures and loss may negatively impact performance through TCP timeouts.

Loss and latency associated issues can affect other protocols in the communications stack, e.g., UDP, integrated with media streaming or VoIP, or any wireless link-layer design. Congestion may occur in a network when an amount of traffic on a communication link or path exceeds the capacity of the link or path. In such cases, excess data may be discarded or excess data may be buffered until congestion eases. However, if congestion persists, the congestion is controlled by discarding data packets in the buffer to clear the buffer in a packet-switched network. Moreover, channel impairments or interference may also result in signal to noise ratio (SNR) degradation and bit errors, which may in turn result in packet errors or erasures.

User Datagram Protocol (UDP) is utilized in communications networks primarily for real time applications that do not benefit from delay based reliability mechanisms (retransmissions). UDP is typically a fixed rate transmission without reliability mechanisms. In lossy environments, UDP based communication such as VoIP and video can appreciably degrade creating perceptible loss of fidelity.

In recent years, multimedia data is often conveyed through a best-effort communication network such as the Internet. In this type of data transfer, a download transmission system or a stream transmission system is used.

The multimedia data can include, for example, video files, audio files, combinations of these, and data including these as part. In the present disclosure, the multimedia data is used in the meaning of data including time information or information relating to a play-out order.

In the case of the download transmission system a data file is downloaded from a delivery server to a recording area at a receiver, and at the point in time when the transfer has completely ended, the play-out is started. Accordingly, the download transmission system is unsuitable for the play-out of multimedia data in which the play-out takes a long time, or for the play-out of multimedia data in which a real time play-out is required.

On the other hand, in the case of the streaming transmission system, the play-out of a data file is started by only partial data being transferred from a sender to a receiver. Thus, this is used for Internet telephone services, remote video conferencing, video on demand streaming, network camera streaming, Internet television and other services.

Thus, there exists a need for a method and system for reducing performance loss in a wireless communication network and enhancing transport layer protocol performance in lossy communication channels due to misinterpretation of the loss as being related to congestion. There is also a need for a method and system to increase network resiliency to bit or packet erasures.

Network Coding (NC) disclosed by *Network Information Flow*, by Rudolf Ahlswede et al published in IEEE TRANSACTIONS ON INFORMATION THEORY, VOL. 46, NO. 4, JULY 2000, has shown promise for improving information flow and delivering better performance in networks. In network coding, packets flowing in a network are considered algebraic entities; hence packets can be used by a transmitter to form sets of linear equations containing extra information to help with recovery of packets lost in transmission by a receiver.

U.S. Pat. No. 7,706,365 to Effros, et al. (Apr. 27, 2010) discloses randomized distributed network coding. The patent discloses a network and a method for transmitting processes in a network where a randomized coding approach is provided. Network nodes transmit on each outgoing link a linear combination of incoming signals specified by independently and randomly chosen code coefficients from a finite field.

While the methods disclosed in Effros et al. can be advantageous over routing-based approaches, the use of randomized coding adds overhead and larger payload due to the transmission of the coefficients in-band.

BRIEF SUMMARY OF THE INVENTION

In a lossy communication infrastructure deploying protocols such as TCP or UDP, computer operating systems need to be modified with error correction to maintain high useful and timely data throughput.

We have proposed a system to provide loss recovery for both guaranteed data transmission protocols, such as TCP, and non-guaranteed data transmission protocols, such as UDP, that do not require modification within the operating system of the receiver or transmitter devices.

The present invention provides 1) connection between the operating system network stack and the user programming space, 2) a selector for separating guaranteed data transmission protocols from non-guaranteed data transmission protocols 3) erasure coding methods to correct networks losses for both guaranteed data transmission protocols from non-guaranteed data transmission protocols; and 4) a method to transmit/receive the information over standard UDP/IP protocol stack.

The present disclosure provides a transmission technique, which causes the retransmission system of an undelivered packet (TCP) and the erasure coding system to operate efficiently.

The packet transmission system of the invention transmits a packet that may or may not have a limited arrival deadline through a best-effort network. The packet transmission system of the invention includes:
a) an automatic packet retransmission section to control retransmission of an undelivered packet;
b) an erasure coding section to create combined packets each carrying multiple raw data packets and to add a redundant data packets to a block of one or more data packets; and
c) a redundancy determining section to dynamically determine level of necessary redundancy based on observed network state information, so that a loss rate after error correction at a receiver achieved by only the recovery of the undelivered packet from already received combined redundant packets satisfies an allowable loss rate. The system includes preferred methods and apparatuses.

A method of transmitting a data block having a limited arrival deadline (such as UDP) is provided. The data block contains a data window of a set N number of packets. The method comprises setting a loss estimate value M; setting the number of packets in the data window to a first number of packets N corresponding to a window size of N; erasure coding the N packets to create a set of M packets each containing one linear combination of the original N packets; transmitting the data block, so that the transmitted data block contains the N original packets followed by the M packets each containing a linear combination of N original packets.

A method of transmitting a packet having a guaranteed delivery without a fixed deadline is provided. The data block containing a data window of a number of packets, the method comprising: setting an initial loss estimate value of M erasure recovery packets; setting the number of packets in the data window to a first number of packets N corresponding to a window size of N; erasure coding across said N packets to create a set of M linear combinations, which are linear combinations of the original N packets; adding new linear combinations of the original N packets, transmitting the data block, wherein the data block contains the N original packets+M erasure recovery packets; dynamically determining the amount of redundancy based on the received network state information and a transmission rate of the data packet block, to adjust the initial loss estimate value for the recovery of the lost packet after error correction at the receiver, and recalculating the number of erasure recovery redundant packets based on the updated loss estimate value; and transmitting a second data block comprising N linear combination packets and the updated number of redundant erasure recovery packets; wherein the number of proactive erasure recovery packets for the data window is based on an estimated packet loss rate.

There are many other examples of alternative methods of generating coded packets including Reed-Solomon (RS) coding, LDPC (Low Density Parity Check) coding, Luby transform (LT) coding, Raptor coding, Network coding or other types of erasure codes can be used.

In any case the "sequence-agnostic" property of FEC may be used to reconstruct the packet flow because the order does not matter. Additionally, the transport layer can deliver in-order data segments to the application even as it waits for more coded packets to recover the losses.

The preferred embodiments uses a constructor such as TUN, TAP, or a Proxy which connects information data flow from the kernel space of the operating systems network stack in the kernel space to the user space. The TUN virtual device provides a connection from the Internet Protocol (IP) layer of the network stack to the user space. The TAP virtual device provides a connection from the Media Access Control (MAC) layer of the network stack to the user space.

According to a preferred embodiment, the number of added redundancy packets can be optimized according to the state of the network without unnecessarily increasing the congestion of the network or unnecessarily reducing the transmission rate of the data packet block. Thus, the loss rate after error correction at the receiver can be kept within a desired range.

A first packet transmission apparatus is provided. The packet transmission apparatus transmits a packet having a guaranteed delivery without a fixed deadline through a best-effort network. The packet transmission apparatus includes an automatic packet retransmission section to control retransmission of an undelivered packet, an erasure coding section to control transmission of redundant information, and a loss estimation section to dynamically determine the level of redundancy necessary to maintain a lossless connection based on observed network state information. The network state information would comprise the packet loss rate. The loss estimation section is configured to dynamically determine the level of redundancy necessary to maintain a lossless connection based on the received network state. In preferred embodiments, the network state information comprises round trip time information.

A second packet transmission apparatus is provided. The packet transmission apparatus transmits a packet having a guaranteed delivery with a fixed deadline through a best-effort network. The packet transmission apparatus includes an automatic packet retransmission section to control retransmission of an undelivered packet, an erasure coding section to control transmission of redundant information, and a loss estimation section to dynamically determine the level of redundancy necessary to maintain a lossless connection based on observed network state information. The network state information would comprise the packet loss rate. The loss estimation section is configured to dynamically determine the level of redundancy necessary to maintain a lossless connection based on the received network state. In preferred embodiments, the network state information comprises round trip time information. In preferred embodiments, the network state information also comprises packet inter-arrival time information on the receiving end of the data communication channel.

In preferred embodiments, based on the received network state information and an upper limit value of a transmission rate assigned for a transmission of the data packet block and the redundancy packets to cause a designated loss rate for the retransmission of the undelivered packet after error correction at a receiver; the system dynamically determines a number of redundant packets to be added to the data packet block based on the received network state information and the upper limit value of the transmission rate assigned for the transmission of the data packet block and the number of redundant packets to cause the designated loss rate after recovery of the undelivered packet using erasure coding at the receiver.

In preferred embodiments the apparatus would comprise both a first and second packet transmission apparatus to handle data traffic with or without fixed deadlines. The inventive method provides the following processing functions in a packet transmission apparatus, which transmits a packet limited in arrival deadline through a best-effort network:

(a) a control mechanism for packet automatic retransmission function to control retransmission of an undelivered packet;
(b) a user or kernel space erasure coding function to add a redundant packet to a data packet block;
(c) a user or kernel space redundancy deter determination function to dynamically determine redundancy of the redundant packet added to the data packet block based on observed network state information, so that a loss rate after error correction at a receiver achieved by only the recovery of the undelivered packet from redundant packets satisfies an allowable loss rate; and
(d) a method for connecting the network stack information from the kernel space to the user space.

According to a preferred embodiment, the number of redundant packets can be optimized according to the state of the network. Thus, the loss rate after error correction at the receiver can be kept within an allowable range without unnecessarily increasing the congestion of the network or unnecessarily reducing the transmission rate of the data packets.

While RLNC is a preferred method of erasure coding, we have discovered that a second method of erasure coding balances performance with overhead and payload considerations.

There is disclosed a method of transmitting blocks of data packets from a source node to a receiver node in a network by way of a coding node, comprising:

(a) transmitting, from a source node, source processes;
(b) receiving, at a coding node, the source processes for the purpose of implementing downstream reception of source processes, received from source nodes, by a receiver node;
(c) deterministically choosing a vector of coding coefficients using a predictable sequence generating algorithm without randomness, uncertainty or ambiguity, wherein the overall linear combination of input signals is specified as a vector of coefficients;
(d) calculating a linear combination of the source processes and the vector of coding coefficients;
(e) transmitting the linear combination of the source processes and vector of coding coefficients;
(f) receiving, at a receive node the linear combination of the source processes and coding coefficients;
(g) reconstructing the source processes using the vector of coding coefficients and the linear combination of the source processes and coding coefficients, wherein there is no transmission of a vector of coding coefficients through the network; one or more receiver nodes, wherein receiver processes are observable at the receiver nodes.

In a preferred embodiment a known function is transmitted from said coding node to said receiver node, and said vector of coding coefficients is calculated at said coding node and at said receiver node using said predetermined function. In a preferred embodiment, a code book comprising a plurality of coefficient schemes is resident at said coding node and said receiver node, and a designation of one of said coefficient schemes is transmitted from said coding node to said receiver node, and said vector of coding coefficients is calculated at said coding node and at said receiver node using said designated one of said coefficient schemes.

The new erasure coding method generates the coefficients of linear equations set in a non-random, deterministic (pre-determined) manner. The method in a first preferred embodiment utilizes a code book known to all communication network participants including intermediate nodes. Information about either generating function or "code book" is provided only once when a new user joins the network. Hence, coefficients are predictable and the knowledge of the code book at both ends of the transmission eliminates the overhead for coefficient transmission or re-generation. A second preferred method uses a pre-defined polynomial equation, e.g. Factorial, Fibonacci sequence, such that the coefficients need not be transferred from and to each node involved in the transfer of information.

With either preferred coefficient generation method, at each transmission opportunity, a linear combination of packets is sent with a pre-determined set of coefficients. As both the source and destination have prior knowledge of the sequence used, there is no need to use any other protocol, i.e. headers, for transmitting the information end to end. Furthermore, there is no need to signal reusing a sequence—it is automatically restarted at the beginning of every transmitted block.

In a preferred embodiment, the erasure coding method is used in connection with a network comprising:
  a) one or more source nodes, wherein source processes are observable at the source nodes;
  b) one or more receiver nodes, wherein receiver processes are observable at the receiver nodes; and
  c) one or more coding nodes for encoding or decoding, allowing communication of the source processes to each receiver node, the coding nodes being connected with input links for communication of input signals to the coding nodes and output links for communication of output signals from the coding nodes to the receiver nodes, wherein the output signals are a linear combination of the input signals and wherein coefficients of the linear combination are pre-determined.

In a preferred embodiment, the overall linear combination of source processes present in each signal in the network is specified as coefficients, each coefficient corresponding to a source process. In a preferred embodiment, the coefficients are updated at each coding node by applying to the coefficients linear combinations. In a preferred embodiment, the linear combinations applied to the coefficients are the same as the linear combinations applied to data transmitted through the network.

In an alternative embodiment, disclosed is a network comprising a set of communication nodes wherein each node can be a source of information, a receiver of information or both a source and a receiver simultaneously. Each node of the network is capable of forming and dispatching information units to communicate with other nodes of the network and each node in the network is a Deterministic Linear Network Coding (DLNC) functional entity where the DLNC function within each node of the network is capable of accessing information generated or received by such a node either partially or in its entirety. Furthermore, the DLNC function within each node of the network is capable of establishing a logical communication link with another DLNC function on a different node. The DLNC function in each node possesses an encoding and decoding functionality where the DLNC in the source node is generating a set of coefficients by using a "code book" or predictable sequence generator that eliminates randomness, uncertainty and ambiguity from the coefficient generation process. The DLNC in the source node is forming new information units by linearly combining original information units generated by a source node using the coefficients wherein the resulting new encoded information units are communicated by the DLNC function in a source node to single or a multitude of a receiver nodes of the network.

In a preferred embodiment, the network is an unrestricted topology network.

In a preferred embodiment, the set of generated coefficients belongs to a finite field.

In a preferred embodiment, an algorithm is used in the network to generate the N×N coding matrix based on rotating coefficients in the row vector of coefficients by one position and generating extra coefficients as needed by shifting the original row vector by one position in the ordered list.

In a preferred embodiment, an algorithm is used in the network to reorder a set of coefficients to ensure linear independence of the additionally generated linear equations.

In a preferred embodiment, both ends of a link are initialized to ensure proper operation in pre-determining the sequence as well as informing the receiver of this choice by a field in the control packet header. DLNC provides advantages including flexibility and low overhead.

Additional features and advantages are described herein, and will be apparent from, the following Detailed Description and the figures.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein:

FIG. 3a shows an alternative transmission scheme of the inventive method;

FIG. 12 shows a Network Coding Decoding Operation using Random Linear Network Coding Solving a Set of Linear Equations that may be used in connection with the DPR protocols shown in FIGS. 1-4;

FIG. 13 shows a Network Coding Packet Format With Full Coefficient Transmission using Random Linear Network Coding that may be used in connection with the DPR protocols shown in FIGS. 1-4;

FIG. 14 is a schematic view of an embodiment of the Network Coding Packet Format of the present invention that may be used in connection with the DPR protocols shown in FIGS. 1-4;

DETAILED DESCRIPTION

The present invention provides a UDP encapsulated communications tunnel using a proprietary protocol that ameliorates a number of the technical shortcomings of alternative transport protocols like TCP and UDP and improves transmission quality and network good-put. Preferably, the TCP implementation provides a higher attainable maximum bandwidth and lower latency by creating a much shorter effective RTT as seen by TCP layer in a communication stack; therefore, improving the inefficiencies of TCP primarily associated with its congestion management mechanisms. TCP traffic is processed by an erasure coding module which in addition to erasure protection also provides connection management, reliability, congestion control, flow control, and multiplexing. The custom protocol supported over a communications tunnel via the erasure coding module is referred to in this disclosure as Dynamic Packet Recovery (DPR™). The UDP implementation incorporates a reliability support and congestion avoidance mechanisms.

Figure 1:
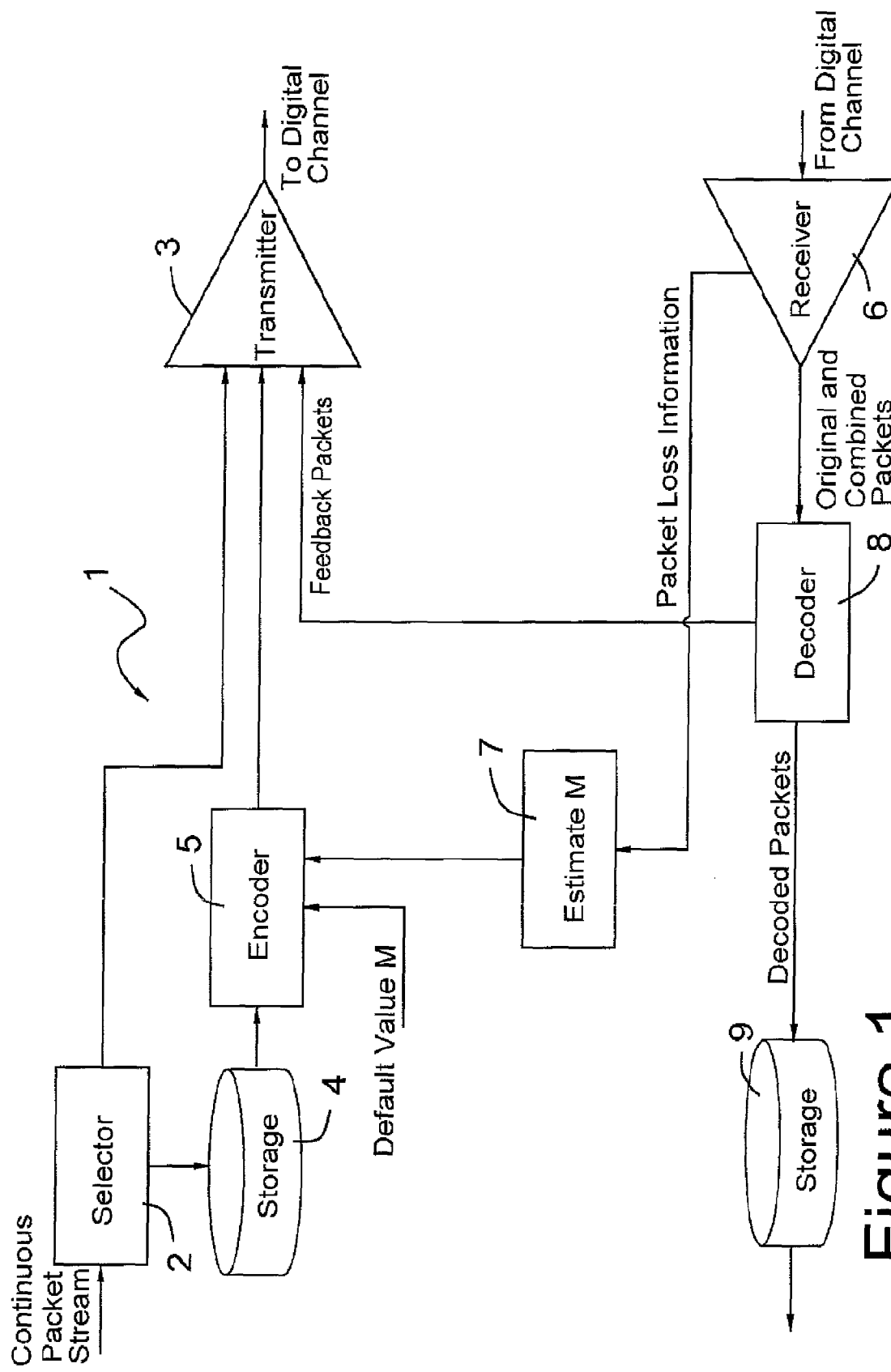
FIG. 1 shows a preferred embodiment of a system using Applicant's packet recovery protocols.
Figure 2:
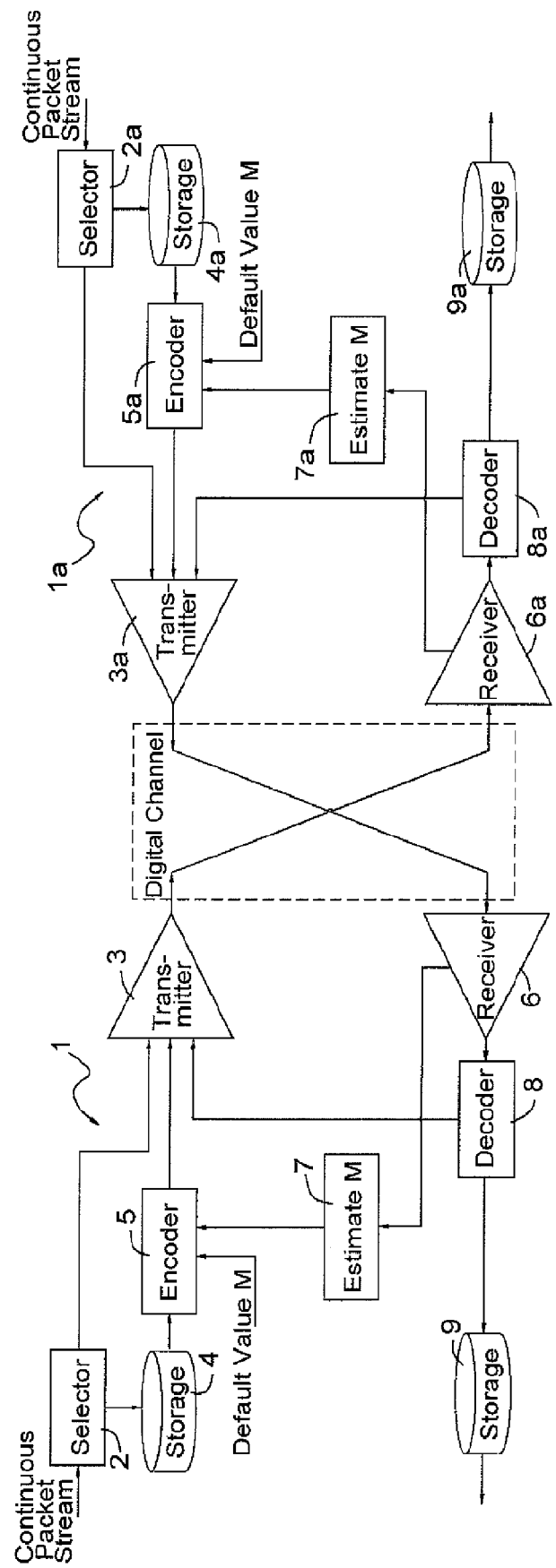
FIG. 2 shows a preferred embodiment of a data communications system using Applicant's packet recovery protocols implemented using a pair of transceivers of the type illustrated in FIG. 1.

Referring to FIG. 1, a transmitting transceiver 1, enabling for example duplex communication with a receiving transceiver, such as transceiver 1a in FIG. 2, constructed in accordance with the present invention is illustrated. Transceiver 1 comprises a selector 2, which receives an input comprising a continuous packet stream to be transmitted over a digital channel, such as the Internet. The packet stream comprises a series of data packets. These data packets are received by selector 2 which, after an optional minimal latency interval adjusted to accommodate the time needed for erasure coding, as described below, passes an initial block of data packets, comprising a predetermined number of packets N, to a transmitter 3 for transmission over the digital channel.

In accordance with a preferred embodiment of the present invention, a block of N data packets is sent from a transmitting transceiver to a receiving transceiver. The system also transmits a number of coded packets. Generally, the N data packets contain all the information in the particular block being transmitted, then all of the blocks together represent the total information to be transmitted during any given segment, which may represent a music track, video, document, image or other item to be moved from one point, for example, connected to the Internet, to another point.

If all of the data packets in a block of data packets are received with no losses at the receiving transceiver, there is obviously no need to employ additional measures. However, typically, one or more data packets are highly likely to be lost during a particular transmission cycle.

Thus, in accordance with the application of erasure coding in accordance with the present invention, additional coded packets are transmitted along with the N raw data packets. Coded packets are packets that are generated from the N raw data packets to be transmitted in accordance with the encoding algorithm of the particular erasure coding method being used. Accordingly, at the transmitting side of the data communications channel a block of N data packets is input into an encoding algorithm that generates a desired number of coded packets.

At the receiving transceiver on the receiving side of the data communications channel, the raw data packets received and the coded packets received are input into the decoding algorithm if the coding method is used. The algorithm then outputs reconstructions of the original raw data packets that were lost during the transmission of the N raw data packets.

The received raw data packets, $N_r$, received by the receiving transceiver, are then interleaved with the reconstructed data packets $N_a$, generated by the decoding algorithm, to assemble a faithful reproduction of the original stream of N raw data packets transmitted by the transmitting transceiver.

Forward error correction in the form of erasure coding is facilitated by storing the initial block of raw packets N in a memory 4 of the transceiver as illustrated in FIG. 1. Erasure coding is implemented by encoder 5 which generates $M_0$ coded packets. $M_0$ is the initial number of coded packets to be sent along with the data packets, and is equal to a default value for M, which may be arbitrary, but is preferably set on the basis of the expected quality impairment or range of likely vulnerabilities of the expected transmission channel. Coded packets are generated to enable the replacement of lost packets in connection with packets recovered by the particular erasure coding scheme being used. Using an erasure coding methodology of the type referenced below, the coded packets are used to generate lost packets.

It is also noted that other forward error correction schemes, such as Reed Solomon encoding, may also be used in accordance with the present invention. Other suitable erasure coding schemes are well known in the art and may be employed in the present invention.

In a possible application using the system of FIG. 1, the number of raw packets N may be, for example, 100. In such an application, one might typically encounter a level of reliability of 98% in the channel. This would render likely the successful transmission of all 100 data packets by transmitting two coded packets (M=2) with the 100 data packets. Each of the two coded packets are generated by encoder 5, resulting in a total of 102 packets for transmission. However, to err on the side of reliable reception, a default value for $M_0$ (to be employed when the transmission begins) may be set relatively high, for example at five coded packets, corresponding to a 5% (M/N) loss.

This default value is used by encoder 5 to generate five coded packets, which are output to transmitter 3. In accordance with a preferred embodiment of the invention, as soon as the five coded packets have been generated by encoder 5 with an optional minimal latency delay, these five coded packets are transmitted via transmitter 3 following the transmission by transmitter 3 of the 100 data packets. Thus, the system has transmitted 105 packets, comprising 100 data packets and five coded packets.

The nature of a digital channel, for example, a TCP/IP channel, is such that only good usable data packets are received. Errors accordingly take the form of missing packets. At the receiving end of the transmission line of the 100 data packets, all the data packets received are counted and the number of data packets received at the other end of the digital communications channel is transmitted back to the receiver portion 6 of transceiver 1. This information is sent to, for example, a computing device 7, which is programmed to determine an estimate for the number M of coded packets necessary to render the transmission of all 100 data packets very likely to be successful. This information is used for two purposes, as more fully appears below; first, to provide a revised value, $M_1$, for M. During the transmission of the next block of data packets, $M_1$ is used and $M_0$, the default value, is discarded. Second, this information also tells the system how many additional packets are needed to successfully transmit the block of packets, if all data packets have not been received. As appears more fully below, these additional packets are transmitted by the system before it proceeds to the next block of data packets. It is also noted that each of these additional coded packets are all different from each of the coded packets in the initial set of coded packets. This ensures that sufficient different coded packets are available at the receiving transceiver to reconstruct lost data packets.

Various algorithms may be used to take this packet loss information and use it to determine if the value of $M_0$ (or any subsequent value of M) should be increased, decreased or left unchanged. In accordance with the invention, a re-estimation of the value of M and possible adjustment of that value is done in conjunction with the transmission of each block of data packets. This can be understood from the following examples.

For example, if the initial system settings are block=100 and $M_0$=5 assume that all 100 data packets were successfully received, and taking into account the expected quality of the digital communications channel, computing device 7 may reduce the value of M from five ($M_0$) to four ($M_1$). Thus, on the next go around the second block of 100 data packets and four coded packets generated by erasure coding by encoder 5 will be transmitted.

Successive successful transmissions of all 100 data packets in successive blocks of data from the continuous data packet stream input into selector 2 may, in accordance with an algorithm resident in computing device 7, result in successive reduction of the number M until it reaches, for example, two, if, for example, the characteristics of the digital communications channel being accessed by transmitter portion 3 are well known and not expected to be often of a quality to successfully transmit a block with only one coded packet. If the communication channel is such that better reliability may occasionally occur, computing device 7 may be programmed to periodically test the channel by reducing M to one, and keeping it at that value until there are repeated failures to successfully transmit the 100 data packets in a given block, as such repeated failures would indicate longer term degradation in the communications channel, due to any of the various factors which might cause that, such as congestion, weather, etc.

Likewise, using the same methodology, computing device 7 may accommodate reduced communications channel performance, for example, a report from the remote transceiver at the other end of the communications channel that only 94 data packets were received, by increasing M, making $M_1$ equal to six, seven or even a higher value and keeping it there for an extended period of time, again, periodically testing the channel to determine whether channel reliability is increasing. Naturally, testing of the channel to determine unreliability is not needed because receiver 6 will, for every transmission, indicate when fewer than the 100 data packets, in the continuous packet stream are input into selector 2.

In accordance with the invention, the number of data packets received is counted at the other end of the digital communications channel utilized by transmitter 3 and that information is sent over the communications channel to receiver 6 which sends this information to computing device 7.

Likewise, considering the reception side of transceiver 1, because transceiver 1 is also receiving data transmitted in similar fashion to the above from a remote point at the other end of the communications channel, a decoder 8 is provided to count the number of good data packets received from the remote transmission point by receiver 6. The number of data packets received is then communicated by decoder 8 to transmitter 3 which sends this information to the remote transceiver at the remote transmission point at the other end of the, for example, full duplex digital communications channel used by transmitter 3 and receiver 6, as more fully appears below.

It is noted that the invention may be applied to systems in which there is complete symmetry in the information being transmitted by both communicating transceivers, or where the data loads are very asymmetrical.

As noted herein, encoder 5 implements erasure coding. Decoder 8 is programmed to receive data packets and coded packets of the type generated by encoder 5 and solve for the contents of missing data packets. In accordance with the disclosed embodiments, it is contemplated that an encoder having the same characteristic as an encoder 5 is located at the other end of the duplex communications channel in a remote transceiver in duplex communication with transceiver 1.

The successfully transmitted data packets received from the remote transceiver at the other end of the duplex digital communications channel are detected by decoder 8 and sent to memory 9. When decoder 8 has determined that a complete block of data packets has been received, it communicates this information to memory 9, which may be instructed to download this information to another, optionally more permanent, location in memory or to a downstream device.

Returning to the transmission methodology, as alluded to above, occasionally, perhaps frequently, less than the 100 data packets in a particular block of 100 data packets from the continuous packet stream input into selector 2 will be received. When this occurs, in contrast to prior art, for example UDP systems, data packets are not retransmitted. In TCP systems, the raw data packets are re-transmitted.

Rather, in accordance with the invention, the number of missing data packets is communicated from receiver 6 to computing device 7, and instead of transmitting data packets an additional time, coded packets are transmitted. Likewise, if needed, coded packets are transmitted to regenerate the missing packets.

If the number of lost packets is greater than $M_0$, the delta between initial loss estimate value $M_0$ and the actual number of missing packets $M_1$ is calculated. A message is sent to the encoder to generate $M_1$-$M_0$ additional coded packets so that all of the missing packets can be regenerated.

As alluded to above, if a great number of data packets are missing at the other end of the channel, M would be changed, from the default estimate of five, to a relatively high number. For example, if $M_0$ were initially set at five, and it was determined that eight data packets were missing, at a minimum, it would be necessary to transmit three more coded packets, thus making for a total of eight coded packets in the initial example. In such an instance, $M_1$ would be set at eight, and the additional three coded packets, which would be generated by encoder 5 are transmitted.

However, the system may initially overcompensate, for example setting M at twelve, and transmitting seven additional coded packets. In accordance with the erasure coding scheme, the additional and the original coded packets would be used together with the successfully transmitted and received data packets from the subject block of 100 data packets to generate the missing data packets.

In accordance with the erasure coding scheme, the raw packets received and the erasure coded packets received would be used together to generate missing data packets and recreate the necessary 100 data packets from decoder 8 to storage 9, which are a combination of some portion of the original data packets and coded packets.

In this manner the retransmission of large blocks of data packets multiple times is avoided.

Moving forward, $M_1$ is now the new loss estimate value. In the above example, it was eight. $M_n$ continues to adjust so that the loss estimate value for the next set of packets is based on the last value of $M_n$.

While the continuous adjustment of the loss rate value M is a preferred embodiment, it is understood that initial values of M and the adjustment of the values of M can be varied according to user need. If desired, the initial loss estimate may be set at zero packets so that the initial loss estimate is not set until there is packet loss.

It is further noted that coded packets may not be successfully received and it then becomes necessary to generate and transmit replacement coded packets. The generation of the replacement coded packets is determined by the particular forward error correction or erasure coding scheme being used. Decoder 8 accordingly functions to determine whether data packets or coded packets have been lost based on information provided to receiver 6 by the portion of the transceiver at the other end of the duplex communications channel, which performs the function of decoder 8.

Turning to FIG. 2, a data communications system comprising transceiver 1 and a remote transceiver 1a, is illustrated. Transceiver 1a is substantially identical to transceiver 1. Transceiver 1a comprises a selector 2a, a transmitter 3a, a memory 4a, an encoder 5a, a receiver 6a, a computing device 7a, a decoder 8a and a memory 9a, which, respectively, operate and cooperate with each other in the manner of selector 2, transmitter 3, memory 4, encoder 5, receiver 6, computing device 7, decoder 8 and memory 9 in transceiver 1. Transceivers 1 and 1a are coupled to each other over a digital channel, as illustrated with transceiver 1a receiving signals transmitted by transceiver 1, and with transceiver 1 receiving signals transmitted by transceiver 1a.

Figure 3:
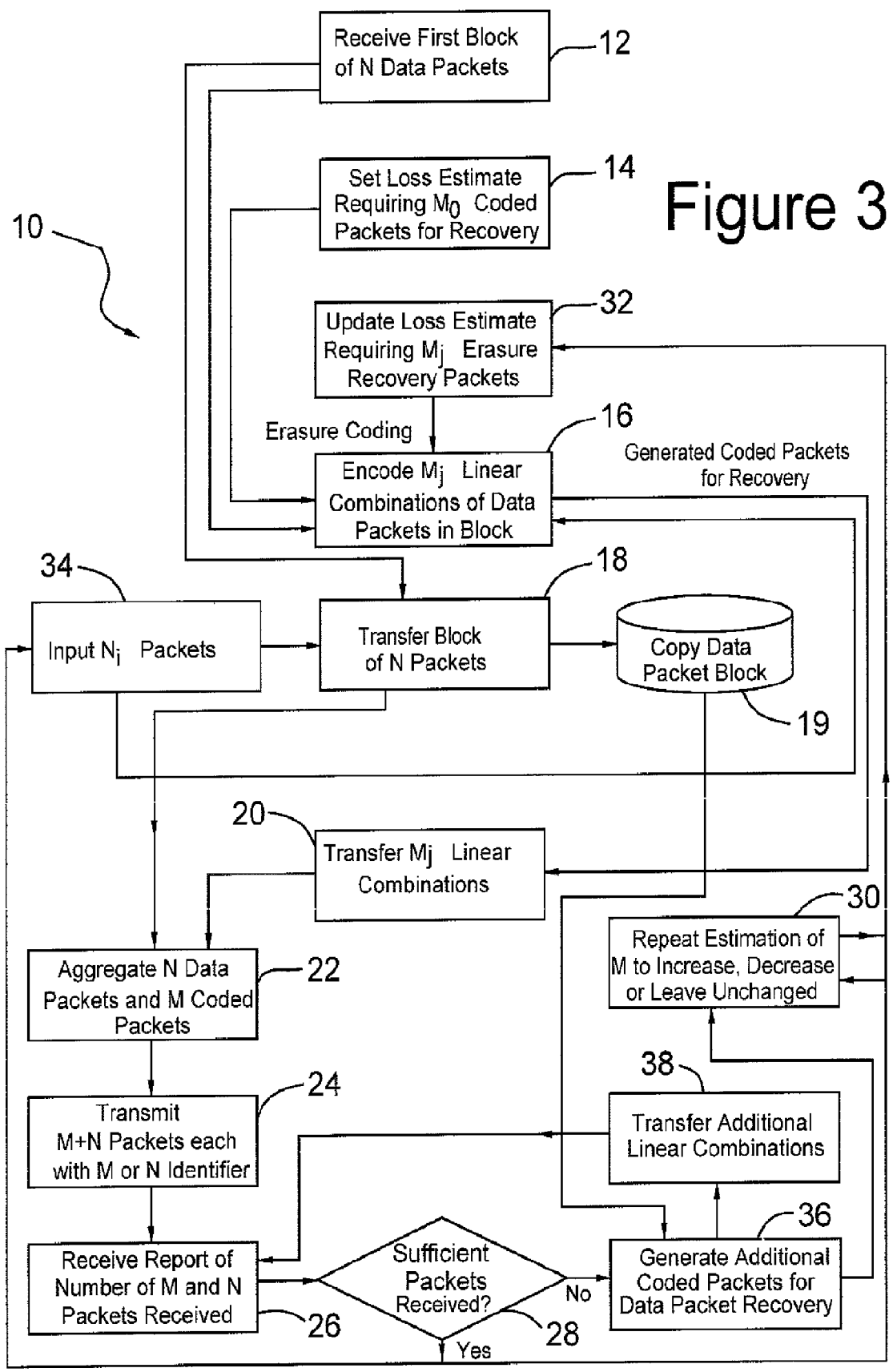
FIG. 3 shows a preferred embodiment of the inventive method as may be implemented on the apparatus of FIG. 1.

With reference to FIG. 3, the inventive method 10 may be understood in terms of processing steps, which may be implemented as software on a general-purpose computer. The input to the system is a continuous sequence of data packets, which may be framed into windows of N data packets each. These N data packets are received on the system implementing method 10 at step 12. In accordance with the invention, these N data packets are transmitted to a remote point over a digital data communications channel.

When the inventive method is initiated, the system implementing the inventive method first employs a default loss estimate, which assumes that $M_0$ data packets out of the N data packets will be lost. M may be expressed as zero or a larger integer, such as 3 or 5 or may be specified as a percentile fraction of a block of packets and rounded to an integer after calculating the number of packets by the software. At step 14, this estimate is provided to the encoding algorithm of the erasure coding algorithm being employed. More particularly, at step 16, a computing device programmed with the erasure coding algorithm associated with the particular erasure coding scheme is implemented to generate coded packets which, at the receiving transceiver may be used to perform the function of reconstructing lost packets. More particularly, in accordance with a preferred embodiment, the received data packets and the associated coded packets are input into a decoding algorithm at the receiving transceiver to generate the lost data packets. At step 16, erasure coding is performed in accordance with the selected erasure coding scheme resulting in the generation of coded packets which may be used to reconstruct any data packets lost during transmission, provided that sufficient coded packets and data packets have been received to allow such reconstruction.

When the coded packets have been generated, the data packets are transferred at step 18 to a temporary memory sector for temporary storage. A copy of the block of N data packets is preferably stored at step 19 for future use in the event that packet loss exceeds the number of lost packets sufficient for all lost packet to be recovered by the erasure code decoding algorithm at the remote transceiver receiving the data being transmitted. Likewise, coded packets generated at step 16 are transferred at step 20 to a temporary memory sector, also for temporary storage. At step 22, the data packets and the coded packets are downloaded from temporary memory, and are all transmitted at step 24 to a receiving transceiver at a remote point for reception. In accordance with a preferred embodiment, when the data packets and the coded packets are transmitted at step 24, each data packet and coded packet has an identifier indicating whether it is a data packet or a coded packet.

At step 26, the transceiver receives a report indicating how many of the N data packets were lost ($N_L$).

As will be discussed below, if $N_R$ is less than N, it is then necessary to transmit a number of supplemental coded packets $P_s$ where $P_s$ is defined by the equation:

$$P_s = N_L - M_0.$$

In accordance with the invention, it is noted that the total number of supplemental packets $P_s$ is determined by the total number of packets lost regardless of whether they are data packets or coded packets. However, regardless of whether the losses are data packets, coded packets, or a combination of data and coded packets, only coded packets are transmitted to the remote transceiver. A computing device, associated with the receiving transceiver, equipped with the decoding algorithm for the particular erasure coding scheme being used, then takes the received data packets and the requisite number of coded packets and executes the decoding algorithm to reconstruct the data packets which were not received. The decoding algorithm, by processing the received data packets and the received coded packets, calculates the informational content of the lost data packets.

Returning to the data communication transmission methodology illustrated in FIG. 3, at step 28 the report communicating the number of packets lost is received by the transmitting transceiver and the decision is made as to whether further coded packets are required. More particularly, if all data packets and all coded packets have been received (or if the remote transceiver has received enough data packets and coded packets to reconstruct the lost data packets), the system proceeds to step 30, where M is estimated and updated in view of the history of packet loss, and optionally transmission channel characteristics. As alluded to above, M may increase, decrease or remain the same. The new value of M, $M_j$, is calculated at step 30 and at step 32 any previous value of M is replaced by the new value of M.

The system then proceeds to step 34 where the next block of N packets is input into the system. At step 16 this next block of N packets is processed using the encoding erasure code algorithm to generate a number of coded packets $M_j$ (as updated at step 32), which constitute a next set of coded packets. The next set of coded packets and the next block of N packets are then transmitted in accordance with the methodology described above.

However, if, at decision step 28 sufficient data packets and coded packets to reconstruct all data packets have not been entirely received by the remote transceiver, additional coded packets need to be sent to the remote transceiver. Accordingly, the system proceeds to step 36, where the required number of replacement data packets (based on the report of step 26) are generated. The supplemental coded packets are generated using the original raw data packets stored at step 19. The supplemental coded packets are all different from previous coded packets associated with the current data packet block. The number of replacement data packets is equal to the number of coded packets needed to reconstruct lost data from the received data packets. In accordance with a preferred embodiment, an erasure coding scheme in which the number of coded packets must be equal to or greater than the number of lost data packets is used.

As alluded to above, if the number of lost packets $P_L$ is greater than the previous estimate for M ($M_{previous}$), it is then necessary to transmit a number of supplemental coded packets $P_s$ where $P_s$ is defined by the equation:

$$P_s = P_L - M_{previous}.$$

Accordingly, the system returns to step 30, where it increases the estimated value of M to M+$P_s$.

The system also proceeds to step 38 where the supplemental coded packets generated at step 36 are transmitted to the remote transceiver. The system then receives a report from the remote transceiver indicating whether the packets have been successfully received, and then after determining the same at decision step 28 proceeds as described above, until the current block of N packets are all either well received or reconstructed. When this condition has been met, the system proceeds to step 34, where the system proceeds to the next block of N data packets, as described above.

The system continues to send successive blocks of N data packets as described above, until all the data packets in the data packet sequence to be transmitted have been transmitted and successfully received or reconstructed.

Referring to FIG. 3a, an alternative transmission scheme (which is embodied in software running on a general purpose computer, as are the other methods described herein) in accordance with method of the present invention is illustrated. At step 50, the system receives individual packets, for example the first packet or a subsequent packet, in a continuous packet stream. At step 52, the packet received at step 50 is stored. At step 54, the stored packet is transmitted to the remote transceiver and also encapsulated, for example, by being input into the encoding algorithm of the erasure coding scheme for subsequent use in generating an encapsulated raw packet or encapsulated redundant coded packets, which are to be used for reconstructing any lost packets.

At step 56, the system determines whether all the N packets in the block have been input, stored, transmitted and encapsulated. If this is the case, a complete block of N data packets has been input into the system, and generation of the coded packets may begin.

However, if, at step 56 all N packets have not been received, the system returns to step 50 and receives the next packet, repeating the sequence until the complete block of N data packets has been input into the system.

Once the complete block of N data packets has been input into the system, the system proceeds to step 58. At step 58, in accordance with a preferred erasure coding algorithm, the system generates a combined (also referred to as a "coded") packet by linearly combining the content of the N original data packets. At step 60, the combined packet generated at step 58 is transmitted, and the system proceeds to step 62 where a default value for M is set equivalent to or greater than the expected number of packet losses for a single block of data packets. At step 64 the system then determines whether all M coded packets have been generated and transmitted. If all M data packets have not been set at step 64, the system proceeds to step 58 where another coded packet is computed for transmission to the remote transceiver.

If the M data packets have been generated, it is reasonably certain that sufficient information has been received by the receiving transceiver. However, at step 66 the system provides reliability by waiting to receive a report from the remote receiving transceiver that a sufficient number of packets have been received to allow reconstruction of all N data packets transmitted by the system. If the number of packets K that have been received is smaller than the number of raw packets N which were sent, there are not enough packets at the receiving transceiver to reconstruct all of the N original data packets which may have been lost during the transmission. Accordingly, the system proceeds to step 70, where M is updated to a higher number, for example the original value of M plus one (if only one combined or coded packet is necessary to generate the lost data packets, or by a greater number if that is required). For example, if five additional coded packets are required, M may be increased by five. Thus, M may be updated to a value equal to M+(N−K).

In addition to setting the value of M to reflect experienced poor transmission characteristics for the digital channel being used, it is necessary to generate and transmit sufficient number of coded, i.e. combined, packets to reconstruct the lost data packets. This is done by the system returning to step 58 where the additional coded packets are generated, and are then transmitted and have their receipt confirmed by the receiving transceiver, if they have been received.

If, at step 68, the total number of packets received by the receiving transmitter is not less than N, sufficient number of packets have been received to reconstruct all missing data packets, and the system may proceed to step 50, where transmission of the next block of data packets proceeds as detailed above. This is repeated until all blocks of data packets in the transmission and all their constituent data packets have been transmitted and successfully received or reconstructed.

Figure 4:
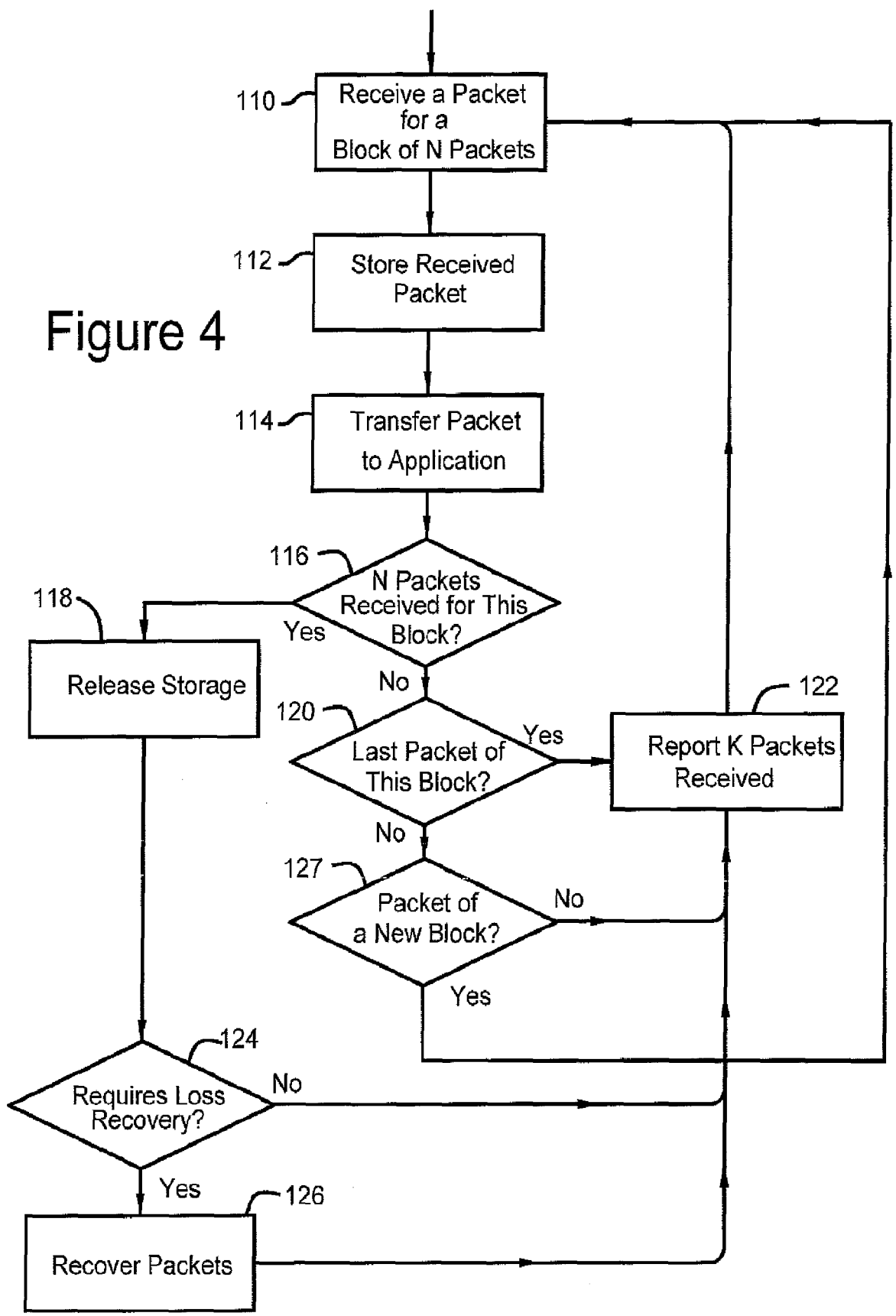
FIG. 4 shows a an alternative embodiment of the inventive method as may be implemented on the apparatus of FIG. 1.

In accordance with a receiving methodology that may be employed in accordance with the present invention, as generally illustrated in FIG. 4, at step 110 a packet is received from the transmitting transceiver. At step 112 the received packet is stored. The system then proceeds to step 114 where the received packet is transferred to the application receiving the download. The system then proceeds to step 116 where, if N packets (that is to say the entire block) have been received, the system proceeds to step 118 where the stored packets are released. Because N packets have been received, no loss recovery is required, as is determined at step 124, and the system reports that the received number of packets K is equal to N at step 122.

If, at step 116, N packets have not been received, the system proceeds to step 120 where it is determined whether the last packet of the received portion of the block of N packets has been received. If less than N packets have been received but the last packet in the block has been received, packets have been lost and that is the reason why fewer than N packets have been received. The received number K of packets is then reported to the sending transceiver at step 122, and replacement coded packets are sent by the sending transceiver.

The replacement coded packets are received at step 110 and processed in accordance with the above methodology until the system at step 116 determines that sufficient packets have been received to allow reconstruction. The system then proceeds to step 118 where the packets are released from storage. At step 124 the system would determine whether lost packets must and can be recovered. Recovery is executed at step 126. This is reported to the sending transceiver at step 122.

If, at step 120, the last packet of the block has not been received, the received packet is either another, for example, packet in the current block or a packet from a new block of data packets. If it is not a packet from a new block, at step 127 the system proceeds to step 122 where the total number K of packets received is reported as above. However, if the packet is from a new block of data packets, the system proceeds to step 110 where it continues to receive packets in the new block.

Figure 4A:
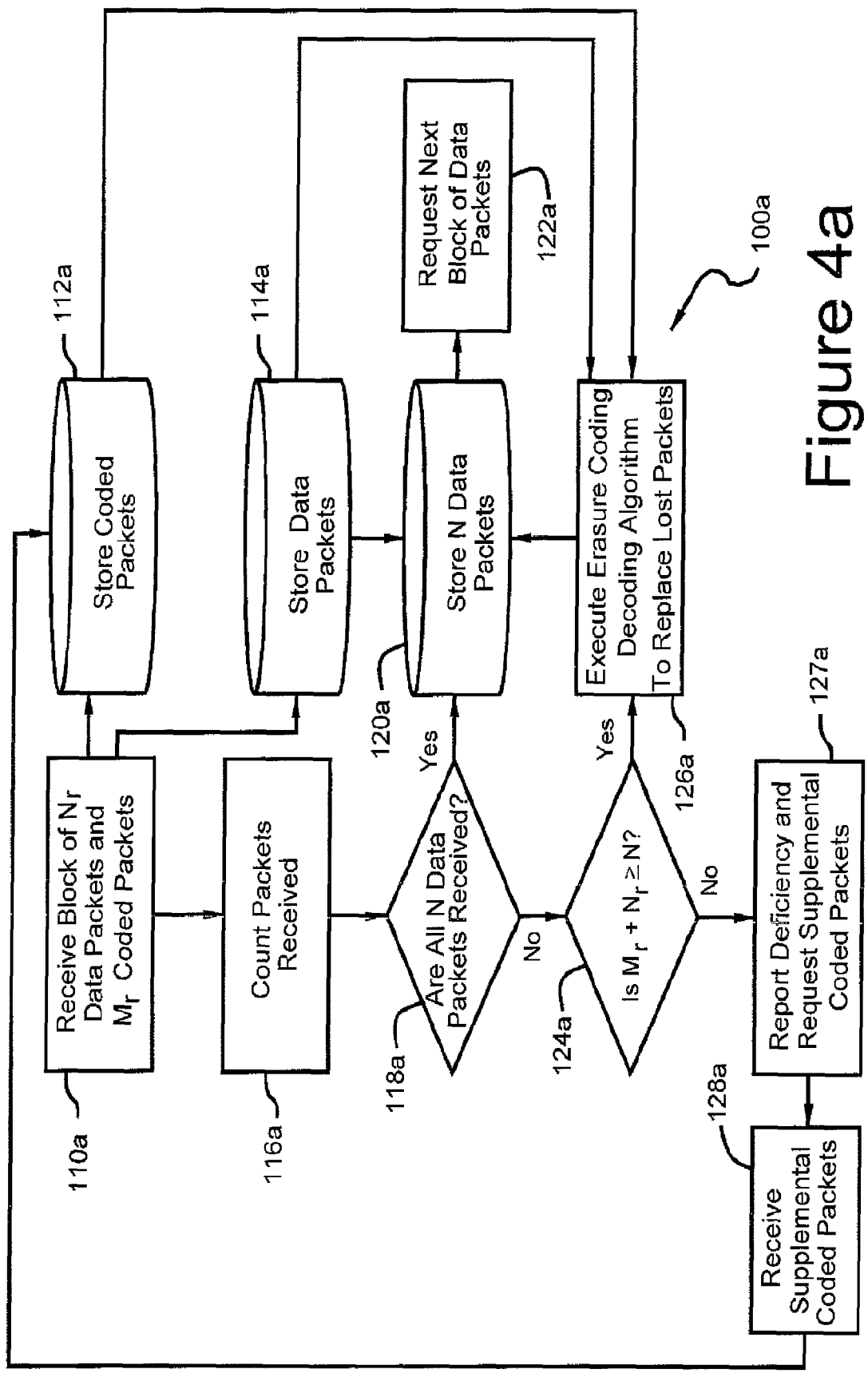
FIG. 4a shows an alternative embodiment of a data receiving methodology as may be implemented in conjunction with the data transmission methodology of FIG. 3.

Referring to FIG. 4a, an exemplary alternative embodiment of a data receiving methodology 100a in accordance with the inventive method is illustrated. At step 110a, in response to the transmission over a digital communications channel, such as the Internet, of a block of N data packets and M coded packets, for example, as provided by the method of FIG. 3, a receiving transceiver receives $N_r$ data packets and $M_r$ coded packets constituting some or all of the block of N data packets and M coded packets originally transmitted by a transmitting transceiver, for example, a transmitting transceiver operating in accordance with the methodology of FIG. 3.

Upon reception, coded packets, generated by the sending transceiver system to be used to replace the missing data packets in accordance with the particular erasure coding algorithm being used by the system, are stored at step 112a. Similarly, also upon reception, data packets may be stored at step 114a. Coded packets and data packets are both coded in their header to have an indicator indicating whether they are coded packets or data packets.

At step 116a, the receiving transceiver system counts the number of data packets which have been received $N_r$ and the number of coded packets which have been received $M_r$.

At step 118a the receiving transceiver determines whether all data packets have been received. If this is the case, the system proceeds to step 120a, where the N data packets, stored at step 114a, are downloaded to a memory which performs the function of accumulating all data packets, whether they are received, or whether they are first lost during an initial transmission of a block of data packets and then reconstructed using, for example, the received data packets and the coded packets, for example, in accordance with the algorithm specified above or an alternative erasure coding methodology.

At step 122a, the system then confirms receipt and or reconstruction of the first block of N data packets and requests the next block of N data packets by sending this information to the transmitting transceiver.

If all of the transmitted N data packets are not received, at step 118a the system proceeds to step 124a where it is determined whether the number of data packets received with the number of coded packets received allows reconstruction of the lost data packets in accordance with the particular erasure coding method being used. More particularly, if the number of data packets received added to the number of coded packets received is greater than or equal to the number of data packets in the current block, the system has sufficient information to use the erasure coding algorithm specified above to reconstruct lost data packets using the decoding algorithm associated with the particular erasure coding methodology being employed.

This decoding algorithm is then executed at step 126a, resulting in generation of all data packets which were lost during the initial transmission of the block of N data packets. More particularly, the original raw data packets stored at step 114a and the coded packets stored at step 112a are input into the decoding algorithm at the receiving transceiver. The decoding algorithm is then used to compute the contents of the lost packets and generate reconstructions of the same.

The reconstructed data packets generated using the erasure coding scheme's decoding algorithm executed at step 126a are then combined with the data packets stored at step 114a to form a complete set of N data packets having the informational content of the block of N data packets originally sent by the transmitting transceiver at the other end of the digital data communications channel. The system then proceeds to store the reassembled block of N data packets (comprising data packets which were well received and data packets reconstructed using the decoding algorithm associated with the erasure coding scheme) at step 120a and request the next block of data packets in the data sequence at step 122a.

If, at step 124a, the receiving transceiver determines that it does not have enough coded packets to reconstruct the lost data packets, the system proceeds at step 127a to request additional coded packets. The request is sent to the transmitting transceiver, and at the transmitting transceiver, the erasure coding and coding algorithm are used to generate additional coded packets which are different from all of the previously generated coded packets associated with the current block of N data packets.

At step 128a, supplemental packets received by the receiving transceiver from the transmitting transceiver are again tested for sufficiency at step 124a, where the system determines whether all the well received data packets and the received coded packets (including those received in the initial transmission with the $N_r$ received data packets in the initial transfer of information in the current block) are sufficient to allow reconstruction of the lost data packets. If such is the case, the system can proceed to step 126a, otherwise it must repeat the cycle (steps 127a and 128a) of requesting and attempting to receive the required data packets.

While, in accordance with the embodiment of the transmitting methodology illustrated in FIG. 3, the decision respecting the number of coded packets to be sent is made at the transmitting transceiver, it is also possible for this decision to be made at the receiving transceiver.

A preferred embodiment of Applicant's proprietary DPR™ Protocol as described in connection with FIGS. 1-4 for ensuring complete packet block reception without retransmission of data packets, is the use of DPR™ Protocol in communication systems such as those described below.

The invention is directed to method and apparatus to establish a communications path across a data communication network between Application A and Application B. Application A and Application B have a standard implementation of the OSI stack including TCP (at layer 4) and IP (at layer 3). A DPR™ protocol governed tunnel is established to carry traffic with TCP flow control being managed using local spoofers, with erasure coding modules providing loss compensation (using algebraic operations over finite fields), connection management, rate control, flow control and multiplexing.

Figure 5:
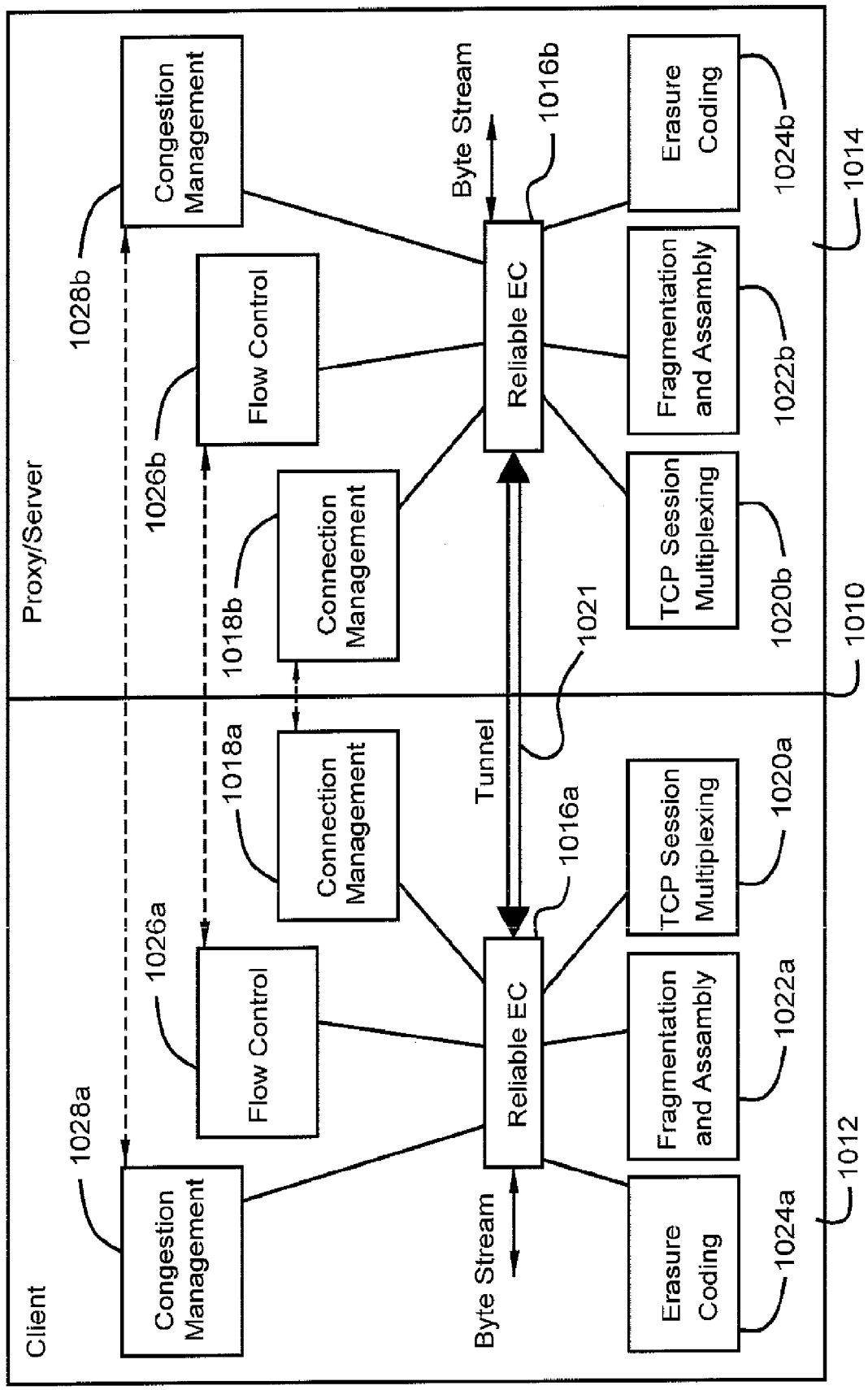
FIG. 5 is a diagrammatic view of the constituent elements of the Erasure Coding Module.

FIG. 5 is a diagrammatic view of the constituent elements that system 1010 is using for transmitting UDP packets reliably between one communications endpoint 1012 (client) and a second communications end point 1014 (server). The Reliable Erasure Coding Modules 1016a on the client side and 1016b on the server side are used in the inventive protocols described below. Referring to FIG. 5, the primary purpose of Reliable Erasure Coding Modules 1016a and 1016b is to create and manage a bi-directional communication channel governed by DPR™ protocol over UDP/IP. Reliable Erasure Coding Modules 1016a and 1016b provide erasure coding, fragmentation and reassembly, multiplexing a multitude of TCP sessions along with connection management, rate control, flow control, and reliable transmission. DPR™ connection establishment and termination is managed by modules 1018a and 1018b. A single (per DPR™ client) DPR™ connection with a corresponding DPR™ server is created and all TCP sessions initiated or terminated by this client are multiplexed in the TCP session multiplexing module 1020a and 1020b into that DPR™ connection. Periodic "keep alive" messages are sent across the tunnel 1021 to verify that the tunnel is up and operational. In addition, these messages provide information on network performance such as RTT (round trip time) and loss rate. The input to the Erasure Coding Module 1016a or 1016b is a data stream that can either be (depending on the direction) raw data or DPR™ encoded packets. The data stream is partitioned into fixed size blocks of N packets to enable erasure coding processing. MTU (maximum transfer unit) value is also fixed in order to prevent further packet fragmentation by the IP layer. A preferred erasure coding schema for DPR™ is systematic random linear network coding as described in U.S. Pat. No. 7,076,315 herein fully incorporated by reference. In this schema, for each block containing N packets, the raw packets are sent in the order of arrival and depending upon the estimated loss rate (ELR), extra coded packets are generated and sent. The erasure coding modules 1024a and 1024b can generate coded packets using either a randomly or deterministically generated multiplication coefficients over a finite field. If the multiplication coefficients are randomly generated, they are embedded in the header of the DPR™ packet for transmission along with the linear combination that was used to construct the coded packet. If the multiplication coefficients are selected using a deterministic algorithm, for example, a sequential list of polynomials over Galois field of specific order, it is possible to avoid transmission of the multiplication coefficients in the packet header by communicating the generating algorithm details to the receiver once at the moment of connection creation and afterwards every time the transmitter makes a decision to replace the currently used algorithm with a different one. Overall latency and jitter can be reduced by performing the erasure coding/decoding operations in parallel with the actual packet flow. The flow across tunnel 1021 is managed by flow control modules 1026a and 1026b. For every block of packets sent by the erasure coding module 1016a and 1016b, an ACK packet is generated by the receiver and returned across the tunnel. The ACK packet is used by the flow control module 1026a and 1026b to manage flow, estimate channel characteristics (ex: RTT, jitter, loss rate), support congestion control, support flow control, and support the reliability schema. The Congestion Management module 1028a and 1028b can use the standard TCP Vegas algorithm.

Figure 6:
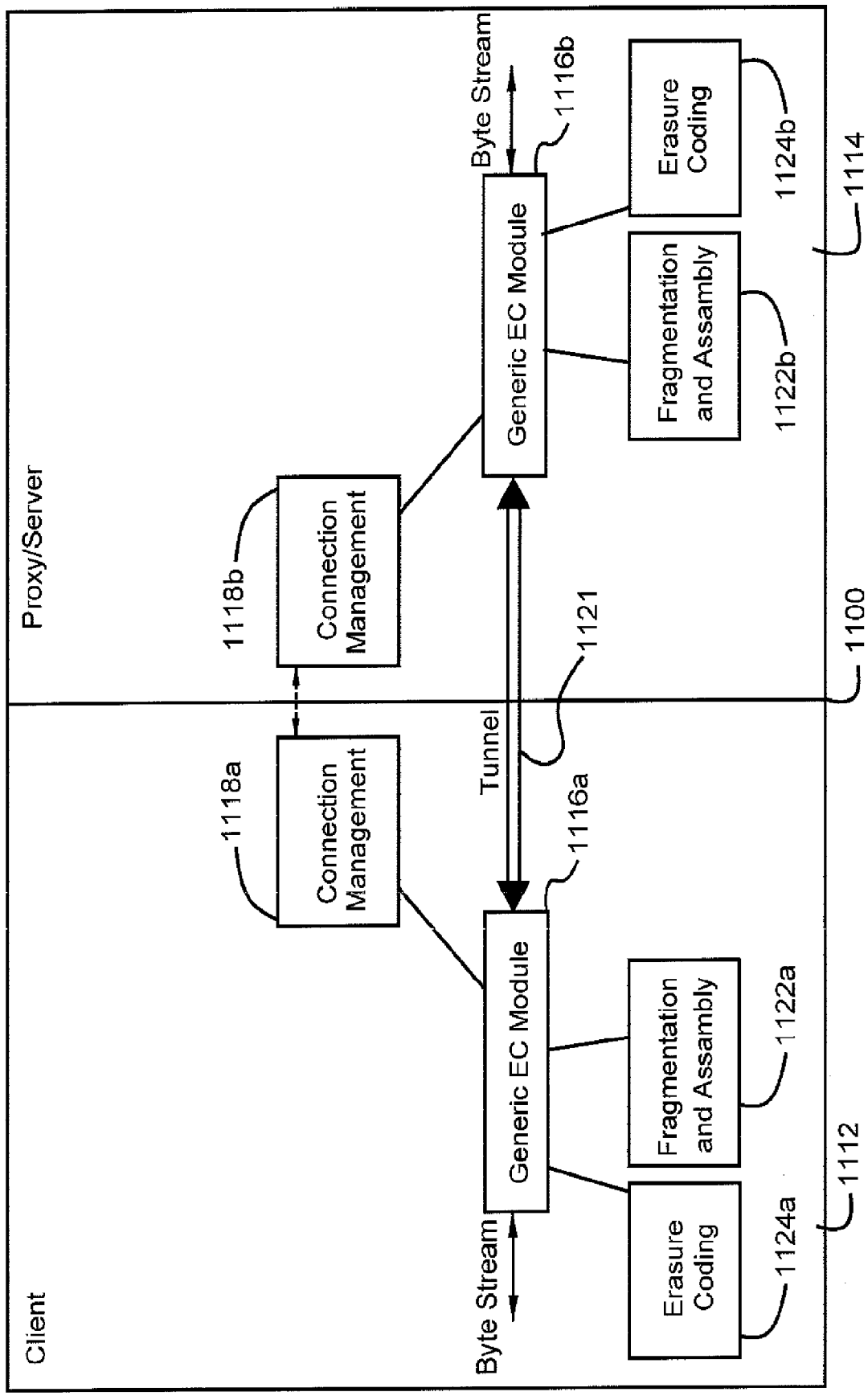
FIG. 6 is a diagrammatic view of the constituent elements of an alternative embodiment of Erasure Coding Module.

FIG. 6 is a diagrammatic view of the constituent elements of system 1100 used for transmitting UDP packets between one communications endpoint 1112 (client) and a second communications end point 1114 (server). The Generic Erasure Coding (EC) Module 1116a on the client side and 1116b on the server side is used in the inventive protocols described below. Referring to FIG. 6, the primary purpose of Generic Erasure Coding Modules 1116a and 1116b is to create and manage a bi-directional connection over a UDP encoded IP connection with the DPR™ protocol. Generic Erasure Coding Modules 1116a and 1116b provide erasure coding, fragmentation and reassembly, and connection management. Connection establishment and closing 1118a and 1118b is implemented with standard UDP state machines. A single DPR™ connection per client is created and UDP datagrams for that client sent into that connection. Periodic "keep alive" messages are sent across the tunnel 1121 to verify that tunnel 1121 is up and operational. In addition, these messages provide information on network performance such as RTT (round trip time) and loss rate. The data input to the Generic Erasure Coding Module 1116a or 1116b (depending on the direction) is a byte stream that can either be raw data or IP packets. The byte stream (or packet stream) is divided into block-sized packets of a predetermined size ensuring that the network MTU (maximum transmission unit) is not exceeded. Fragmentation and reassembly 1122a and 1122b are done within the respective generic erasure coding module 1116a and 1116b. A preferred erasure coding schema for DPR™ is systematic coding. In this scheme, for each block of length N, the raw packets are sent in the order of arrival and depending upon the estimated loss rate (ELR), extra coded packets are generated and sent. The erasure coding modules 1124a and 1124b can generate coded packets using either a random or deterministic code in a finite field. If the coding coefficients are randomly generated, they are embedded in the header of the DPR™ packet. For a deterministic code, it is possible to avoid including the coding coefficients in the header by using a pre-determined lookup table and sending a pointer to the coding coefficients. Overall latency and jitter can be reduced by performing the erasure coding operations in parallel with the actual packet flow.

Figure 7:
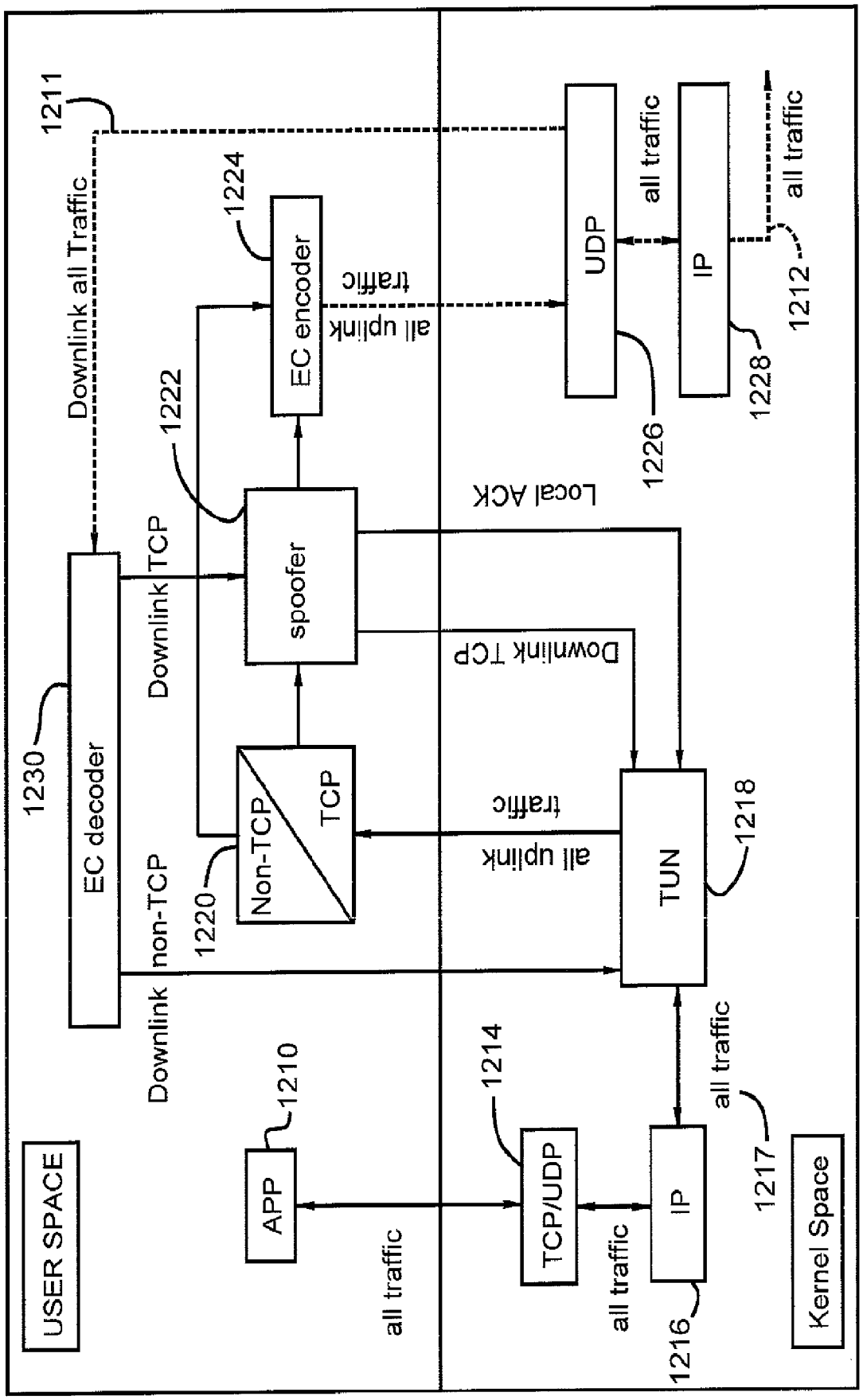
FIG. 7 is a block diagram of the client side implementation.

FIG. 7 shows a high level diagrammatic view of the client side implementation of a preferred embodiment of the invention where both TCP and UDP traffic is managed. Application 1210 typically resides on a physical device such as a cellular phone, a tablet, a computer or an embedded system. Application 1210 communicates across data link 1212 through a communications network to the cloud proxy implementation as shown in FIG. 7. In a preferred embodiment, Application 1210 exists in the operating system's user space 1211. Protocol spoofing is used in data communications to improve performance in situations where an existing protocol is not ideal for high bandwidth delay product, for example, due to long delays or high error rates. TCP connections may suffer from performance limitations due to insufficient window size for links with high bandwidth delay product such as long-delay links. These types of the delays are seen on communication networks such as GEO satellites, cellular networks, Wi-Fi networks and other such networks. TCP's slow-start algorithm significantly delays connection transmission speeds. A spoofing router reduces the TCP congestion loop. This translates the TCP to a protocol similar to XTP.

The TCP/UDP 1214 and IP 1216 portion of the OSI stack is in the operating system's kernel space 1217. The OSI stack cannot be modified without modifying the operating system. In order to gain access to the packet stream, TUN device 1218 is used. TUN device 1218 is a standard virtual device driver that allows the packet stream to be accessed from user space 1211. At this point, the upstream and downstream packet flows are separated. Following the upstream packet flow, packets are delivered to the TCP/nonTCP splitter 1220. TCP/nonTCP splitter 1220 examines the protocol field of the IP header and sends TCP packets to the TCP spoofer module 1222.

All other packet types (such as UDP) are sent to the Generic erasure coding (EC) encoder 1224. Open loop control is used between the Generic EC modules 1124a and 1124b (FIG. 6) between the erasure coding encoder 1224 and server 1330 (shown in FIG. 8) for the coding tunnel 1212. When the client does not receive enough information to reconstruct the packets due to network losses, it will send loss information to the originating Generic EC encoder 1224. EC encoder 1224 will monitor the link for loss information and will increase or decrease the number of coded packets based on the updated loss information.

The Generic EC encoder 1224 provides network coding for the non-TCP packets to implement a reliability layer. The packet flow from the Generic EC encoder 1224 is encapsulated with a UDP header 1226 and an IP header 1228 prior to transmission. Packets from the TCP spoofer module 1222 are sent to the EC encoder 1224. Rate adaptation is performed between the EC encoder 1224 on the client side and EC decoder 1330 on the server side (shown in FIG. 8). The packet stream from EC encoder 1224 is encapsulated with appropriate information from UDP module 1226 and IP module 1228 and transmitted across link 1212. Packets arriving from link 1212 from the server side are terminated at IP 1228 and UDP 1226 layers. All packets are then directed to EC decoder 1230.

EC decoder 1230 uses closed loop flow control between the server 1324 and client 1230 for the erasure coding channel. TCP flow control is explicitly not used in the erasure coding channel. When EC decoder 1230 does not receive enough information to reconstruct the packets due to network losses, it will send a request to the server 1324 to send enough packets to enable reconstruction. The number of packets asked for can be equal to or greater than the number of missing packets. EC decoder 1230 will handle all of the local communication across link 1212 and pass the downlink TCP packets (appropriately decoded) to TCP spoofers 1222 and to kernel based TUN device 1228 to be passed up the protocol stack to application 1210.

TCP spoofers 1222 are shown in FIG. 7. TCP spoofers 1222 are responsible for creating acknowledgements for the local application(s) 1210. It is assumed that the implementer is experienced in the art of TCP state machine design. In a traditional TCP state machine implementation an application can operate as either a passive server (listening) or an active client (initiating). The role of the TCP spoofers is to operate passively and detect either the client or server communication to implement the appropriate matching state behavior as would be seen by the normal opposite end of the TCP state session. There are two preferred embodiments of the TCP spoofers that may be implemented as part of the invention. The first embodiment operates in a transparent mode. In the transparent mode, certain control messages such as SYN, SYN_ACK, etc. are passed through the TCP spoofers, so that the end-to-end TCP connection is established directly between two applications. In this mode, TCP spoofers also pass all the header information of the TCP segments, e.g sequence numbers, time stamps, etc. The second mode is an opaque mode. In the opaque mode, the TCP spoofers completely terminate the TCP session by creating a full (standard) TCP state machine.

Figure 8:
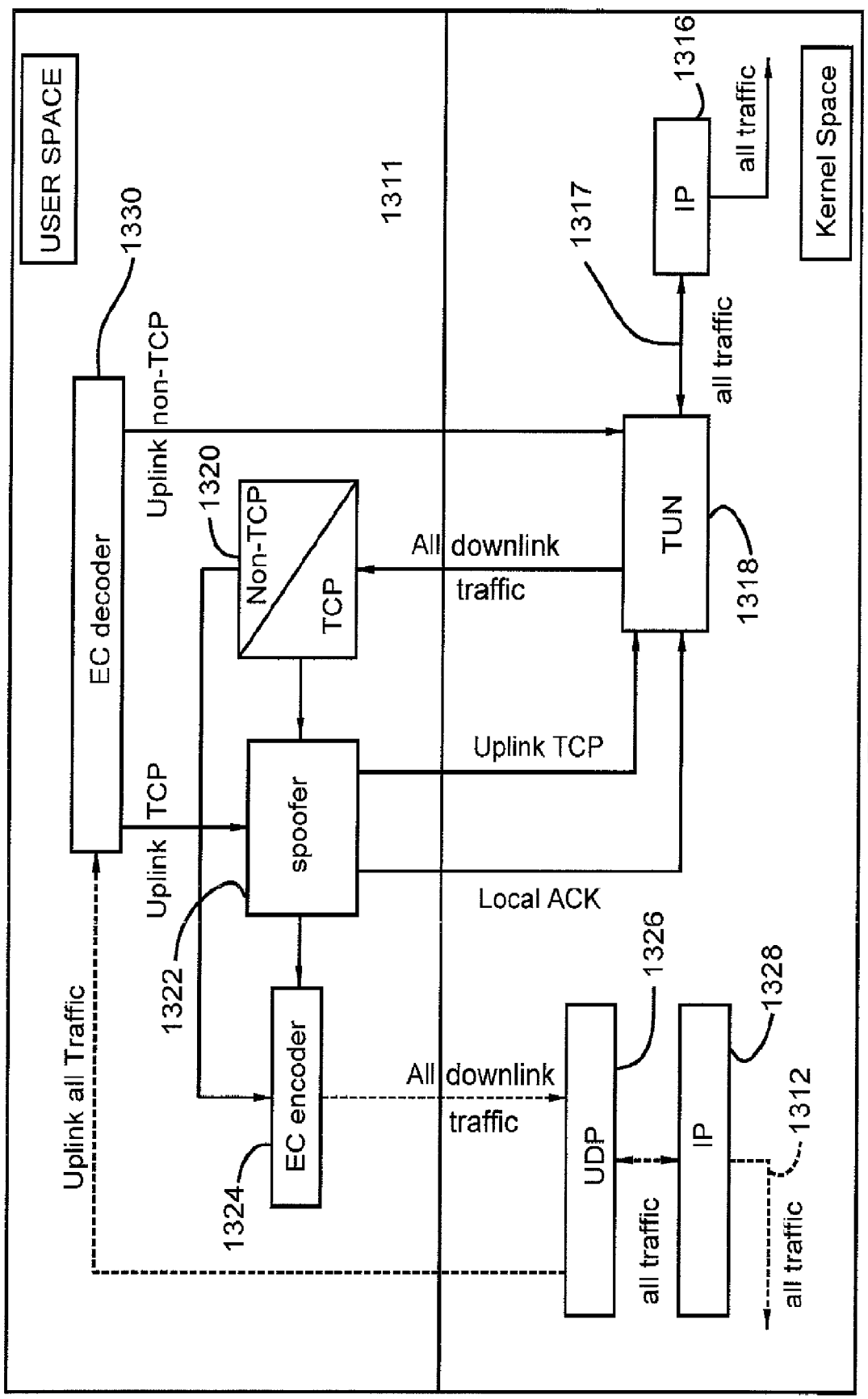
FIG. 8 is a block diagram of the cloud proxy implementation.

FIG. 8 is the high level diagram of the cloud proxy implementation. It is the mating implementation to the client side implementation of FIG. 3. The cloud proxy implementation is conceptually a direct mirror of the client side without an application or the associated TCP stack. Rather the packets come in from client application 1210 over a link 1212 from the client device as described in FIG. 7. Referring to FIG. 8, data is received from the client device 1210 via link 1312 and is processed by IP layer 1328 of the network stack, then by UDP layer 1326 of the network stack. Packets arriving from link 1312 are terminated at IP 1328 and UDP 1326 layers. All uplink traffic is then moved to the EC Decoder 1330. EC Decoder 1330 will handle all of the local communication across link 1312 and pass the uplink packets (appropriately decoded) to TCP spoofer 1322 and to kernel based TUN device 1318 to be passed up IP stack 1316 via link 1317 and then forwarded out to the network. Rate adaptation is performed between EC decoder module 1330 and TCP spoofer 1332 and EC decoder module 1330 in the uplink direction implements erasure decoding, connection management, congestion control, flow control and de-multiplexing.

Figure 9:
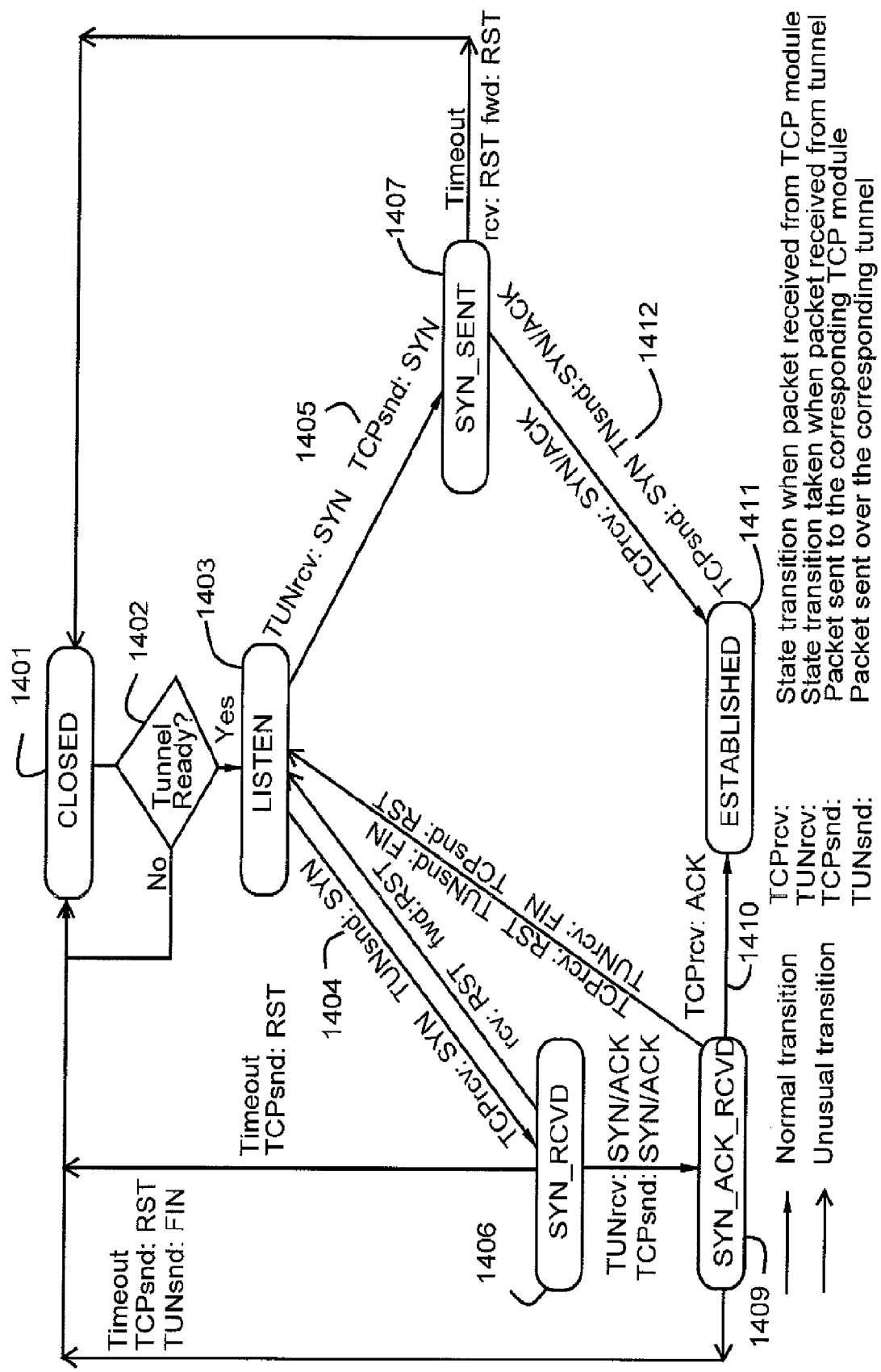
FIG. 9 is a state diagram of the connection establishment state machine for the TCP spoofers in the transparent mode implementation.

FIG. 9 shows the TCP state sequence for establishing a TCP connection from the client to the server in the transparent spoofing mode. As previously stated, TCP spoofer 1322 operates in a passive mode. The starting point for the TCP connection state machine is CLOSED state 1401. The state machine enters an interrogation loop 1402 to determine whether the tunnel has been established across link 1312. If so, it moves into LISTEN state 1403. There are two possible transitions from LISTEN state 1403 predicated upon receipt of a SYN packet either from the local application or from the tunnel. Transition 1404 shows the receipt of a SYN packet from a local application. Upon receipt of the packet, spoofer 1322 creates a new session handler, forwards the SYN packet to the tunnel to its counterpart and enters the SYN_RCVD state 1406. Alternatively, spoofer 1322 could receive the SYN packet from the tunnel and progress via transition 1405 to SYN_SENT state 1407. Transition 1405 causes spoofer 1322 to create a new session handler, forward the SYN packet from the tunnel to the local application, and enter SYN_SENT state 1407. The transition from SYN_RCVD state 1406 is shown as 1408. The transition is evoked when the SYN/ACK is returned from the tunnel. The state machine forwards the SYN/ACK to the local application and enters SYN_ACK_RCVD state 1409. When the local application returns its SYN/ACK the state machine transitions via 1410 to ESTABLISHED state 1411. ESTABLISHED state 1411 indicates that an end-to-end TCP session has been created. Alternatively, the state machine can transition 1412 from SYN_SENT state 1407 to ESTABLISHED state 1411 when a SYN/ACK is received via the tunnel. It should be noted that the simultaneous open condition is not explicitly shown in the Connection Establishment State Machine. In addition, the exception transitions are not explicitly discussed here, but shown in FIGS. 7&8.

Figure 10:
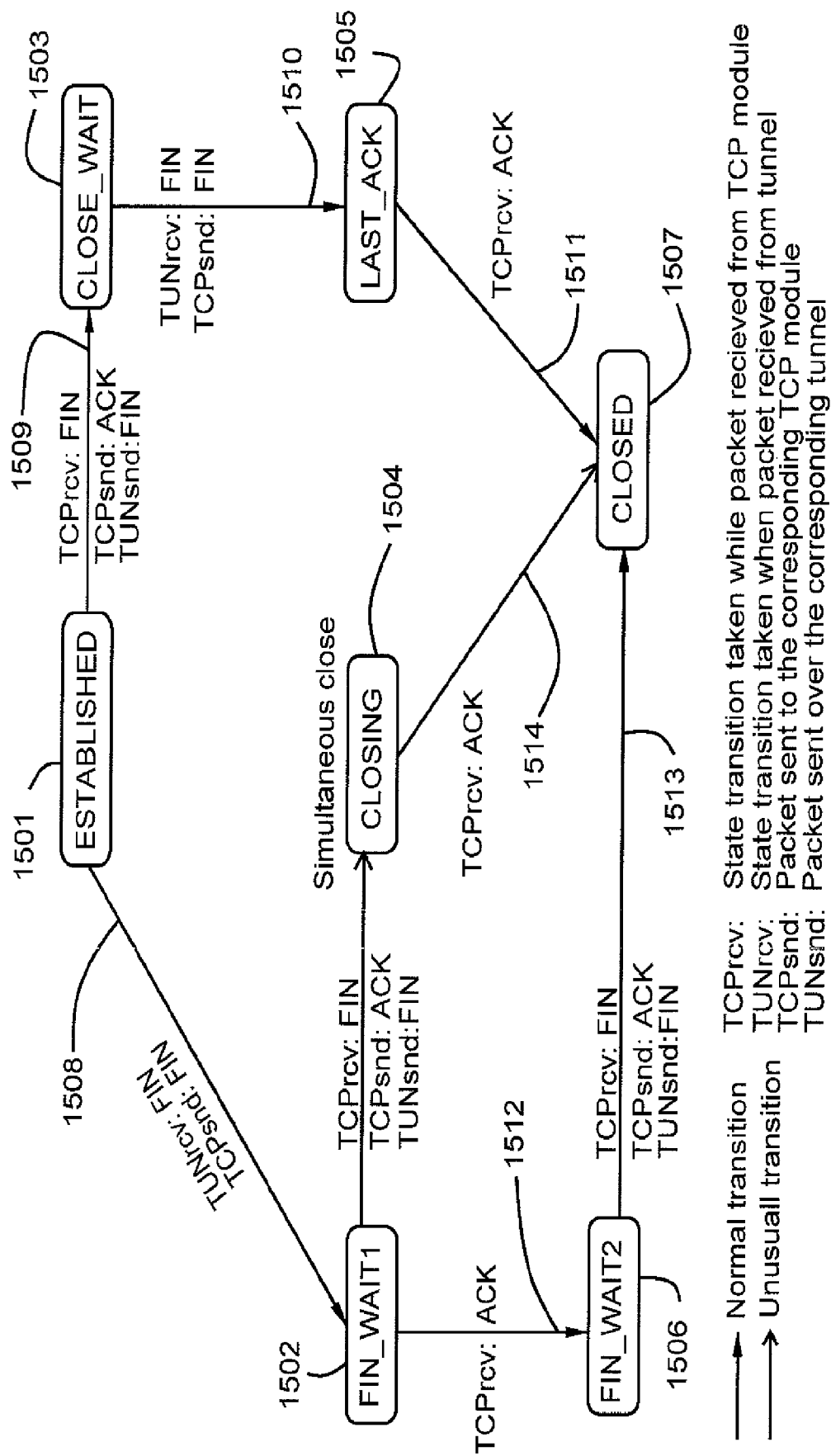
FIG. 10 is a state diagram of the connection closing state machine for the TCP spoofers in the transparent mode implementation.

FIG. 10 shows the state sequence for closing the connection established as shown in FIG. 9. The entry point is ESTABLISHED state 1501 which is the end result of the connection state machine previously described. There are two exit transitions from ESTABLISHED state 1501. If a FIN message is received from the local application, then the state machine moves to CLOSE_WAIT state 1503 via transition 1509. The state machine will send the FIN message to the tunnel and an ACK message to the application. If the state machine receives a FIN message from the tunnel (when in ESTABLISHED state 1501) then the state machine moves to FIN_WAIT1 state 1502 via transition 1508. The state machine will send a FIN message to the application. Continuing from FIN_WAIT1 state 1502, there are two potential exit transitions. If the state machine receives a FIN message from the application, it indicates that there is a simultaneous closing. The local application and the application on the far side of the tunnel are attempting to close the TCP session at the same time. This a very low probability event, however, the state machine will move to CLOSING state 1504 and send a FIN message to the tunnel and an ACK message to the local application. When an ACK is received from the local application, the state machine will move to CLOSED state 1507 via transition 1514 and send an ACK message to the local application. The CLOSED state is the end state for the state machine. The second exit path from FIN_WAIT1 state 1502 occurs when an ACK is received from the local application. This is the normal path and the state machine moves to FIN_WAIT2 state 1506 via transition 1512. The state machine will send an ACK to the local application. The state machine will transition from FIN_WAIT2 state 1506 to CLOSED state 1507 via transition 1513 when it receives a FIN from the local application. It will send an ACK message to the local application and a FIN message to the tunnel. Referring back to CLOSE_WAIT state 1503, the state machine will transition to LAST_ACK state 1505 via transition 1510 when it receives a FIN from the tunnel. The state machine will send a FIN message to the local application. The state machine will transition from LAST_ACK state 1505 to CLOSED state 1507 via transition 1511 when it receives an ACK from the local application. While RLNC is a preferred method of erasure coding, we have discovered a second method of erasure coding that balances performance with overhead and payload considerations.

Network Coding (NC) principles are based on using algebraic equations as an alternative representation of data. For example, an IP packet payload may contain a representation of (9, 10, 2, 4) which represents a binary number, which would be (1001, 1010, 0010, 0100). The packet itself can be represented as a variable such that IP packet 1, IP packet 2, IP packet 3, and IP packet 4 would be represented as a set of linear equations such that four (4) linear equations would be required to solve for the four (4) variables. The equations themselves must be linearly independent to uniquely solve for the four (4) variables.

The state of the art mechanism is to use random number generation techniques. One example of this is disclosed in U.S. Pat. No. 6,857,003 to Saito and a second example is Fortuna, a cipher algorithm. Fortuna is a cryptographically secure pseudorandom number generator (PRNG). See Niels Ferguson and Bruce Schneier, *Practical Cryptography*, (2003).

Nodes are defined as source, destination, or source and destination points for information. Nodes include the first, last, and any intermediate points of information delivery. Nodes transmit random linear combinations of the packets they receive, with coefficients chosen from a Galois field. If the field size is sufficiently large, the probability that the receiver(s) will obtain linearly independent combinations (and therefore obtain innovative information) approaches 1, which is 100% probability.

The mechanism for creating a protocol such that a coding header is used is disclosed in U.S. Pat. No. 8,068,426 (Sundarajan et al) and U.S. Pat. No. 7,706,315 (Effros et al), Sundarajan et al, *Network Coding meets TCP: Theory and Implementation*, Proceeding of the IEEE, Vol. 99 No. 3 Mar. 2011 (all three fully incorporated herein by reference).

The header includes various fields, as well as the source and destination ports. The port information is needed to identify the coded packet's session. This is taken out of the TCP header. The second field is the base. This is the TCP byte sequence number. The next field is N which is the number of packets involved in the linear combination. The next field is the start, which is the starting byte of the $i^{th}$ packet involved in the linear combination, where i goes from 1 to N. The end is the last byte of the $i^{th}$ packet involved in the linear combination. The last field is $a_i$ which is the coefficient used for the $i^{th}$ packet involved in the linear combination. Basically, the starting byte and the ending byte of the $i^{th}$ packet defines the packet.

With RLNC, the coded packets need to contain the coefficients used in creating the linear combinations with pointers to the location of each of the intermediate packets and headers for the coded packet. Since the numbers of packets may vary, the amount of overhead that is used for the coefficient transfer from source to destination is variable and can be quite large for large values of N. Practically for TCP/IP networks, the maximum N for high performance systems is less than or equal to 30. This reduces the utility of RLNC for uses in large file transfer where packets combinations may be greater than 100 and approaching 10K.

We have discovered that we can create linearly independent equations by using pre-calculated coefficients and then distribute the coefficients in a codebook and send the code book to each node involved in the transfer of information. An alternative method to create these equations involves sending a pre-defined polynomial equation (e.g. Factorial) such that the coefficients need not be transferred from or to each node involved in the transfer of information, just the first and last node. The code book or polynomial that is known a priori enables the destination point to understand what the appropriate coefficients are to enable decoding of the linear equations that are transferred and enable the recreations of the original variables (i.e. packets).

A system designer may choose to implement DLNC in connection with a pre-determined code book or code books. One benefit of this system is that the code book can be re-provisioned, similar to cipher mechanisms, such that in midst of a transfer, the code book can be changed. The may be desirable for policy based management of information (e.g. security).

The predictable sequence generating equation requires less memory and can be implemented on very low cost devices.

A typical random linear network coding scheme (RLNC) includes a construction process of a set of N+k linear equations where "k" is estimated Packet Loss Rate (PLR) in a communication channel and comprises the following steps:
1) selecting a vector of random coefficients of the dimension "N";
2) multiplying a packet vector (ordered set of N packets) by a vector of coefficients to obtain a combined packet;
3) repeating steps (1)-(2) to generate "N+k" combined packets.

The resulting set of "N+k" packets is transmitted over a channel and decoded by the receiving end using matrix algebra. To be decodable, given that the coefficients are selected randomly, RLNC requires an internal information exchange to make the encoding vector of coefficients known at the destination. Therefore, a transmitter to a receiver should communicate the following information:
1) the set of coefficients used for composing each combined packet;
2) the number of packets in a combined packet; and
3) the packet length for each packet in a combined packet.

Figure 11:
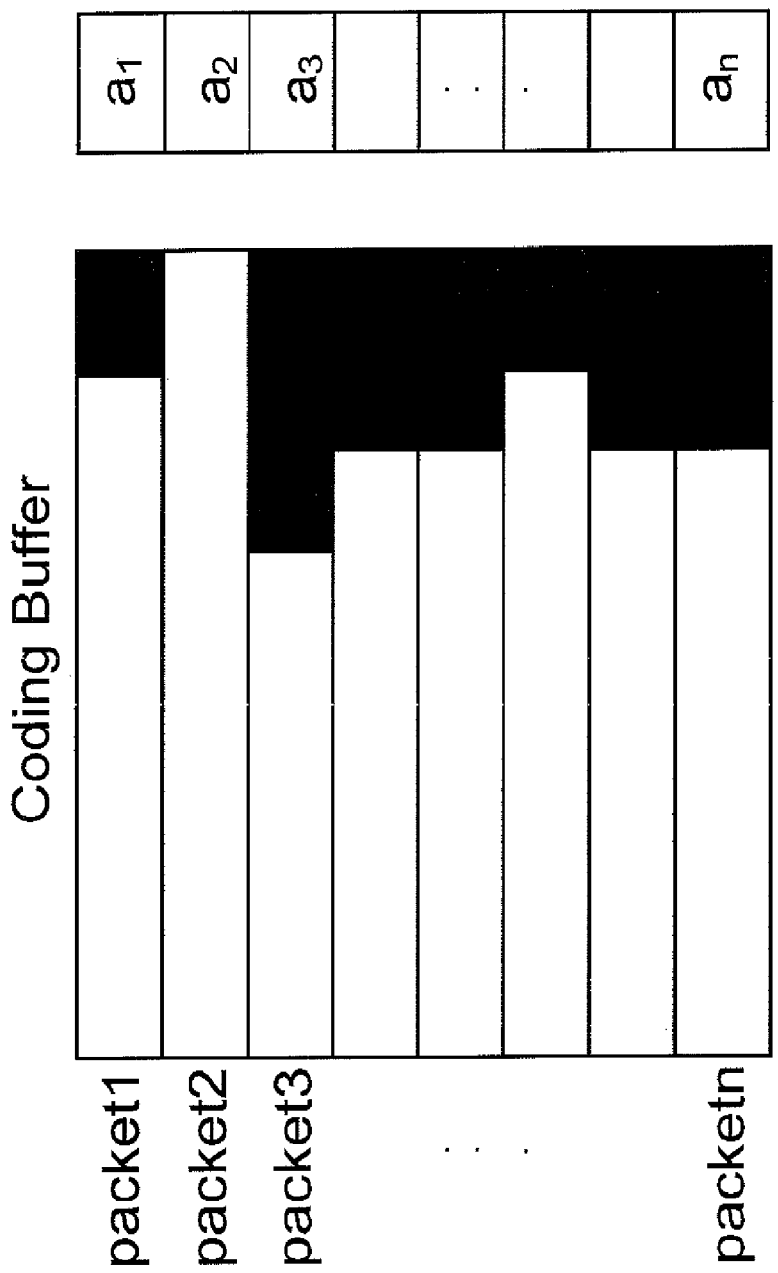
FIG. 11 shows a preferred Network Coding Encoding Operation using Random Linear Network Coding that may be used in connection with the DPR protocols shown in FIGS. 1-4.

FIG. 11 shows a typical encoding process of traditional RLNC while FIG. 12 represents the traditional RLNC decoding process.

Referring to FIG. 11, the encoding process is the matrix multiplication of the packet vector and the coefficient vector, meaning packet, multiplied by coefficient $a_i$ where i goes from 1 to N (the number of packets in the window), and then the intermediate values are summed to create the coded packet.

Typically, in current RLNC implementations, such as NC-TCP for example, the NC supporting information is added as an overlay to the packet header. Put another way, $a_{11}$ through $a_{nn}$ are randomly generated each time. In RLNC, for N packets, the source node will send N packets, add random coding at the NC node and will send out coded packets $NC_1$ through $NC_n$. The coded packets will be decoded at the decoding node and then received by the receiving node. If any packet is lost, then additional packets $NC_{n+1}$ to $NC_{m+n}$, where m is the number of lost packets. Thus, m+n coded packets are sent out in total.

This results in reduced payload size that in turn leads to lower efficiency, especially when superimposed over the modern transport protocols such as TCP/IP. Replacing the random coefficients' selection as used in RLNC by a non-random, deterministic process proposed by the present invention eliminates the need for extra information transfer between transmitter and receiver, and therefore dramatically improves communication efficiency and reliability. This is illustrated in the comparison between FIGS. 13 and 14.

Figure 13:
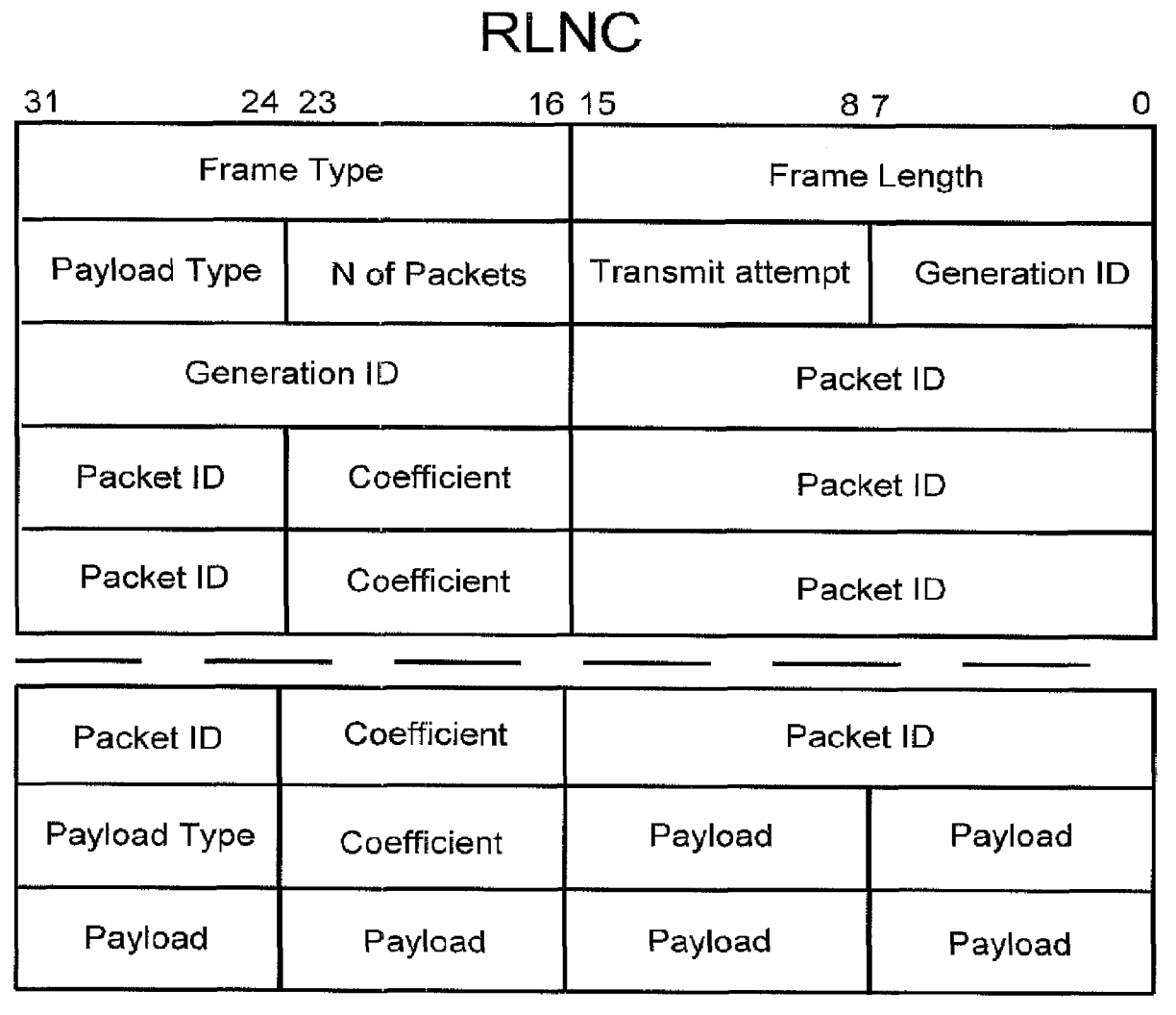

FIG. 13 shows a generic packet format with the NC coefficients transmitted in-band as used in RLNC. FIG. 13 illustrates the added overhead and larger payload due to the transmission of the coefficients in-band when RLNC is used. When decoding a batch of n data packets (e.g. doing a matrix inversion to solve the equation), the order of the equation is $n^3$.

Referring to FIG. 14, when used in conjunction with the present inventive system with pre-determined values in the matrix (DLNC), the values are easier to decode. In the present inventive system, coded packets are always created at the coding node, but not sent out. Only the raw packets are sent. On the receive side, when a non-coded packet is received, it goes to its spot on the matrix. Raw packets will only have a non-zero value on the diagonal. When there is a lost packet, a signal is sent back to the coding node and it generates coded packets $NC_1$ to $NC_m$ where m is the number of lost packets. Therefore, only m linearly combined packets are sent out and only when the packets are needed. When the coded packets are sent back to the decoder, there will be non-zero values in the non-diagonal space of the matrix but typically fewer than the complete size of the matrix, thus, solving the determinant is much easier takes less power.

A preferred embodiment of the invention is the generation of DLNC coefficients using a known sequence embodied by the following example algorithm.

Figure 16:
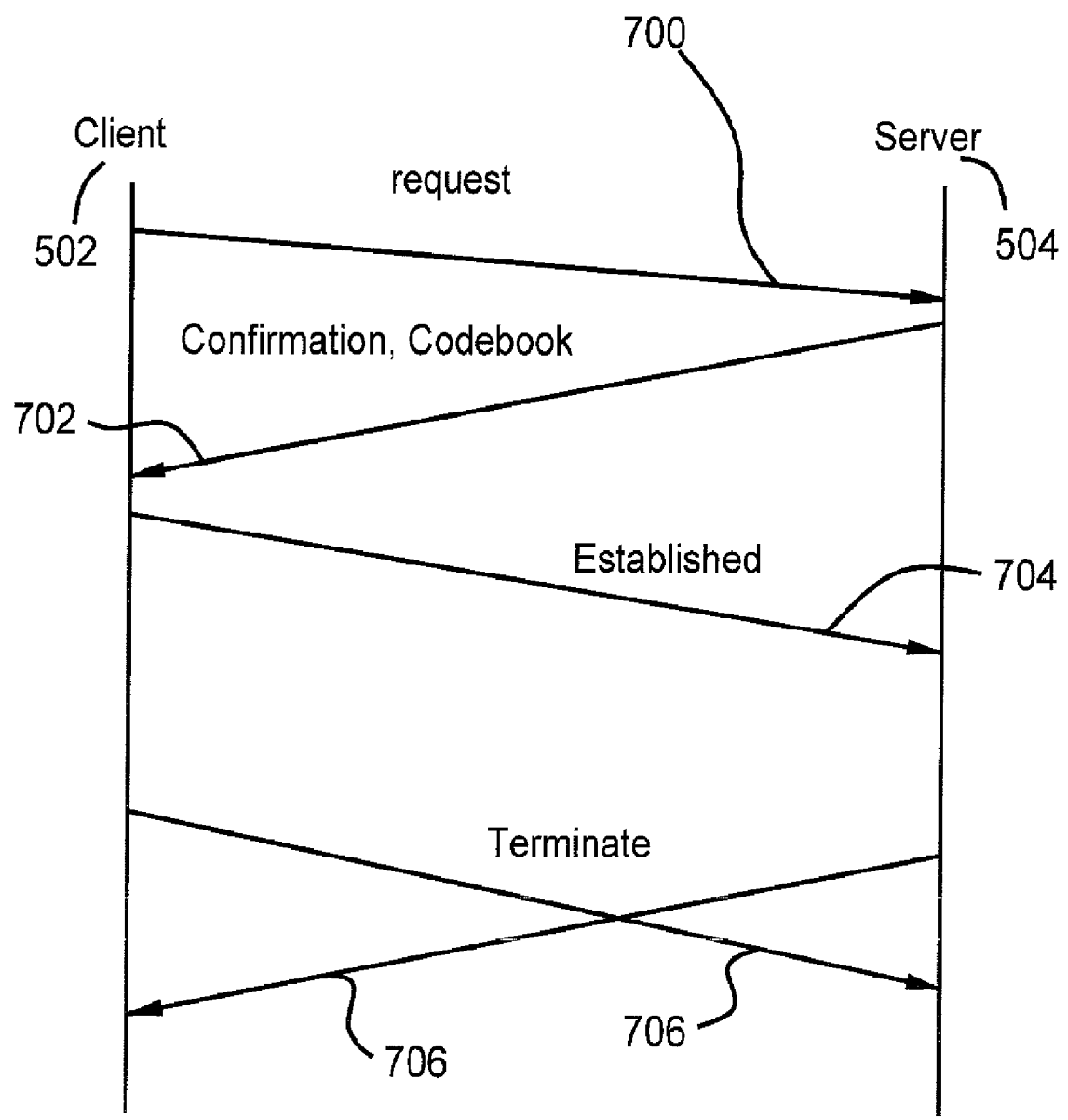
FIG. 16 shows a schematic overview of the connection sequence for setting up a DPR connection using DLNC erasure coding

Referring to FIG. 16, if a DPR™ equipped entity or client 502 (which can be among other things a mobile device, application process,) wishes to establish a DPR™ channel 521, using DLNC it is required to make a connection with another DPR™ equipped device 504 (or a proxy) in a network. A connection is established using three-way handshake similar to a TCP Connection request. A request 700 is sent from client 502 to server 504. A confirmation 702 is sent from server 504 to client 502 returning link parameters including either the code book or the sequence generating equation. Then client 502 sends a "link established" response 704 to server 504. The connection is terminated per request of either client 502 or server 504 using a terminate request 706.

This approach encompasses conditions where the link is comprised of multiple segments. An example of this procedure can be described as follows. If the chosen Galois field (GF) for NC is GF(256), all coefficients are chosen from 0 to 255. There are several potential mechanisms for selecting coefficients within GF(256):

a) An ordered list of prime numbers may be used where the numbers<256 (if the chosen NC field is GF(256)) with the lowest number assigned sequence number 0 SN(0), next one-sequence number 1, SN(1), etc.;

b) For the first row of an N×N coding matrix, N coefficients are selected sequentially starting with SN(0) i.e. 1, 2, 3, 5, 7, 11, ..., SN(k), ..., SN(N−1); this allows the coding of N packets together;

c) For an N×N matrix, the next row of the same matrix is formed by rotating the first row vector right by one place, hence starting with SN(N) and ending with SN(N−1);

d) All N rows of an N×N matrix are formed by the vector of the coefficients for row i, 1≤i≤N, where i is generated by rotation of the vector of the coefficients of row i−1 right by 1 position, starting with SN(N−i+1) and ends with SN(N−i);

e) If more than N equations are required (due to transmission losses), the next vector is formed by selecting N new entries from the same sequence starting with SN(1) instead of SN(0). In other words, if the original generation vector is 1, 2, 3, 5, 7 then the added information vector is 2, 3, 5, 7, 11 and the algorithm repeats. This guarantees enough linearly independent vectors needed to reconstruct the original information are received promptly;

f) Considering a packet generation of size N, each selected sequence of N coefficients is sufficient to generate N equations. A set of 50 prime numbers will produce 50×N distinct vectors. If more vectors are required, reordering the set will be enough to produce the next 50 N vectors. Since there are 50! (factorial of 50) permutations of 50 numbers this method is sufficient to generate a practically infinite number of coefficient vectors. This algorithm enables both ends of the link to operate synchronously with no need for additional information. This greatly simplifies the communication protocol and significantly reduces packet overhead.

A simplified packet format to support the algorithm defined above requires the following header fields to enable successful decoding of the transmitted coded packets:

1 Byte Frame type—to allow distinction between NC data and service packets

2 Bytes Frame length—to allow packet processing

1 Byte Payload type—to allow differentiation between various types of NC data packets, for example raw and combined packets.

1 Byte Try #—retransmission sequence number

3 BytesGeneration ID—coding window sequence number

1 Byte Number of packets in combined packet—to ensure the number of encoded packets is always known

---

Total: 9 Bytes

In addition, each packet to be combined needs to be prepended with a packet length indicator (2 Bytes) prior to being multiplied by its coefficient. This allows coding of mixed length packets.

The additional 2 Bytes bring total overhead equal to 11 Bytes.

An illustration of the proposed packet format is presented in FIG. 14.

Figure 15:
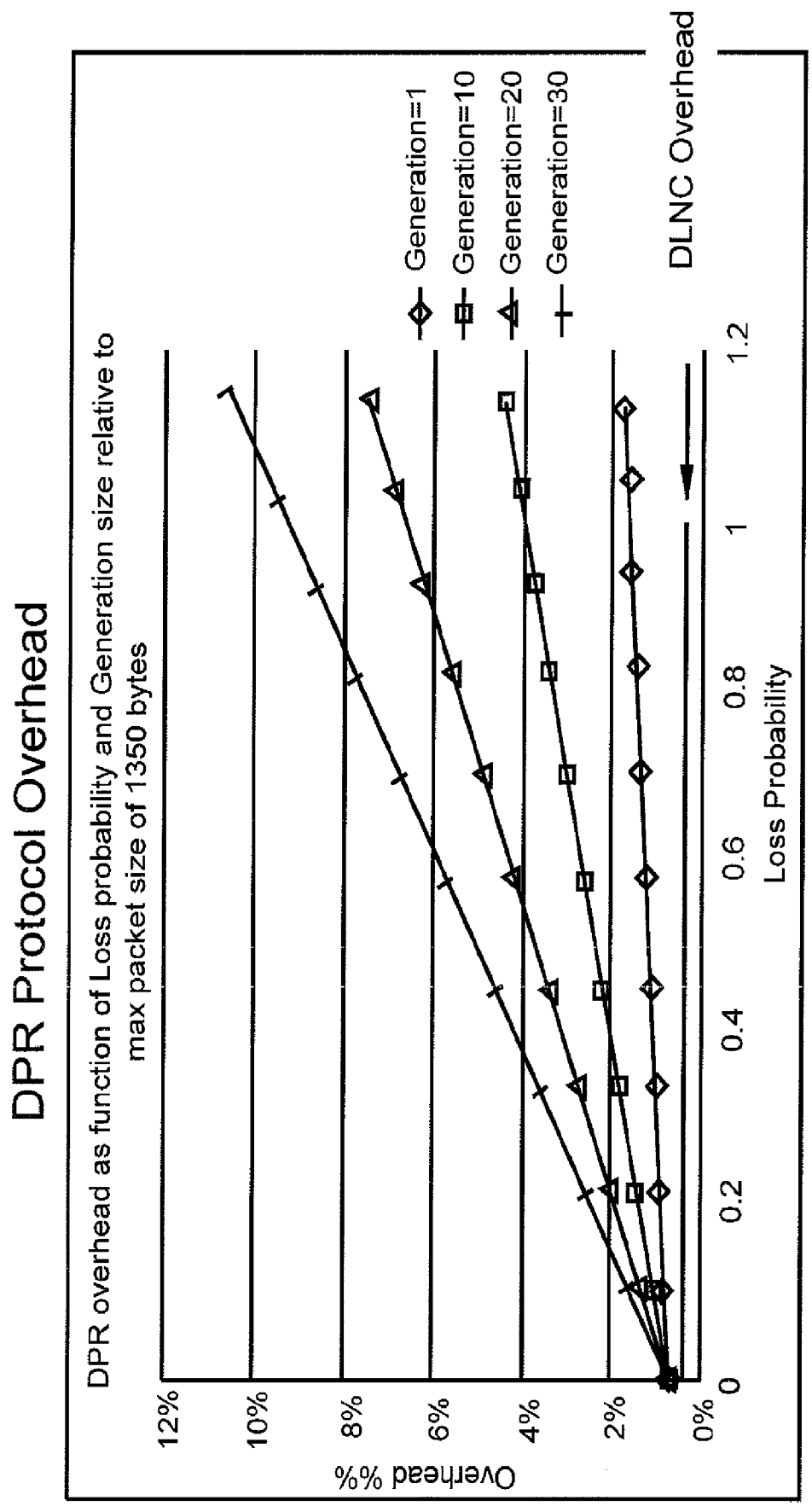
FIG. 15 is a graph showing the DPR Protocol Overhead comparison OF RLNC VS DLNC.

The added 11 Bytes of packet information represent 0.73% of a typical 1500 B packet and 17% of the shortest Ethernet packet of 64 B. Assuming a generation size of 50, a system using DLNC would typically have an overhead of about 3.7%. For a packet size of 64 B, a system using RLNC would typically have an overhead of 85.9%. The present inventive erasure coding method significantly reduces the overhead of previous NC implementations based on direct transmission of the coding coefficients or of information needed to reproduce the random generation. The overhead as a function of loss probability is shown in greater detail in FIG. 15.

An important element of the invention is the generation of the coding coefficients in a deterministic, predictable, and reproducible manner. This leads to several highly desirable characteristics.

First, transmission overhead is reduced and that leads to increased protocol efficiency as the need to send coefficient information along with the coded packets is eliminated. More specifically, in the current RLNC or generally the rateless erasure codes implementations over TCP, the typical overhead is 12 bytes+6 Bytes per packet used in a Block. In the DLNC method this is reduced to 11 Bytes. In the case where the number of packets in a block is 30, and the maximum payload transferred in an IP packet is 1350, and the maximum IP packet size is 1500, the RLNC method uses 192 Bytes of overhead vs. DLNC which has a fixed overhead at 11 Bytes. In this example, RLNC uses 17 times more overhead than Applicant's DLNC method. Practically, this also enables DLNC methods to not be limited by the number of packets used in a block. Since the protocol overhead (11 Bytes) is generation size agnostic, yet another benefit of the proposed format is the ability to use any generation size without a risk of IP packet fragmentation by the lower ISO stack layers.

Second, this method enables reduced complexity test methods that utilize the predictability of the coding coefficients.

Third, the proper selection of coefficients enables a reduction of computational complexity when performing Gaussian Elimination, which is required during the decoding process.

Fourth, the method of coefficient selection using either codebooks or algorithmic coefficient selection enables policy based changing of the codebooks or algorithm during transmission. In addition, since the coding sequence is known at the source and destination, these mechanisms provide inherent reliability and security, as the coded packets cannot be used outside the established link. This is highly desirable when used in conjunction with high value content such as premium broadcast television shows.

The processing functions of the transmission apparatus in the foregoing embodiment can be realized in hardware or software. Not only are all of these processing functions realized by the hardware or software, but also part thereof may be realized by using the hardware or software. That is, the combination of the hardware and software may be adopted.

With respect to the foregoing embodiments, various modified examples are conceivable within the scope of the gist of the invention. Besides, various modified examples and applied examples created or combined based on the recitation of the specification are also conceivable. It should be understood by those skilled in the art that various modifications, combinations, sub-combinations and alterations may occur depending on design requirements and other factors. It should be understood that various changes and modifications to the presently preferred embodiments described herein will be apparent to those skilled in the art. Such changes and modifications can be made without departing from the spirit and scope of the present subject matter and without diminishing its intended advantages.

The invention claimed is:

1. A method of transmitting blocks of data packets from a source node to a receiver node in a network by way of a coding node, where every coding node generates deterministically without randomness, a vector of reusable coding coefficients using a deterministic function universally known throughout the network topology comprising:
    (a) generating at the coding node at system start up, the coding coefficients in a predictable manner through usage of a codebook;
    (b) transmitting, from a source node, source processes;
    (c) receiving, at the coding node, the source processes for the purpose of implementing downstream reception of the source processes, received from the source nodes;
    (d) calculating an output process as a linear combination of the source processes using the vector of coding coefficients;
    (e) transmitting the output process from the coding node wherein there is no transmission of the vector of coding coefficients through the network;
    (f) receiving, at the receiver node the output process; and
    (g) reconstructing the source processes using the vector of coding coefficients pre-generated using the deterministic function that is universally available at every coding node throughout the network topology and the output processes received from the source nodes which are a linear combination of the source processes and coding coefficients, wherein there is no transmission of the vector of coding coefficients through the network; wherein the codebook contains a symbol lookup table for coding and decoding; each symbol having one or more symbols which replace it and wherein all of the decoding nodes have a-priori knowledge of the codebook.

2. The method as in claim 1 wherein the network is an unrestricted topology network.

3. The method as in claim 1, wherein a code book comprising a plurality of coefficient determining methodologies is resident at said coding node and at said receiver node, and a designation of one of said coefficient determining methodologies is transmitted from said coding node to said receiver node, and said vector of coding coefficients is determined at said coding node and at said receiver node using said designated one of said coefficient determining methodologies.

4. The method as in claim 1 wherein the set of generated coefficients belongs to a finite field.

5. An algorithm used in the method as in claim 1 to generate the N×N coding matrix based on rotating coefficients in the row vector of coefficients by one position and generating extra coefficients as needed by shifting the original row vector by one position in the ordered list.

6. An algorithm used in the method as in claim 1 to reorder a set of coefficients to ensure linear independence of the additionally generated linear equations.

7. A method as in claim 1 of initializing both ends of a link to ensure proper operation to pre-determining the sequence as well as informing the receiver of this choice by a field in the control packet header.

* * * * *

UNITED STATES PATENT AND TRADEMARK OFFICE
CERTIFICATE OF CORRECTION

| | | |
|---|---|---|
| PATENT NO. | : 9,258,084 B2 | Page 1 of 1 |
| APPLICATION NO. | : 14/538793 | |
| DATED | : February 9, 2016 | |
| INVENTOR(S) | : Igor Zhovnirnovsky et al. | |

It is certified that error appears in the above-identified patent and that said Letters Patent is hereby corrected as shown below:

ON THE TITLE PAGE

(71) Applicants: Igor Zhovnirnovsky, Newtown, MA (US); Roy Subhash, Lexington, MA (US)

(72) Inventors: Igor Zhovnirnovsky, Newtown, MA (US); Roy Subhash, Lexington, MA (US)

These two sections should be corrected to corrected to read:

-- (71) Applicants: Igor Zhovnirnovsky, Newtown, MA (US); Subhash C. Roy, Lexington, MA (US) --

-- (72) Inventors: Igor Zhovnirnovsky, Newtown, MA (US); Subhash C. Roy, Lexington, MA (US) --

Signed and Sealed this
Third Day of May, 2016

Michelle K. Lee
*Director of the United States Patent and Trademark Office*